(12) United States Patent
Zhang et al.

(10) Patent No.: US 12,227,866 B2
(45) Date of Patent: Feb. 18, 2025

(54) SYSTEMS AND METHODS FOR ELECTROCHEMICAL PROCESS

(71) Applicants: Yuming Zhang, Kunshan (CN); Ruihuan Zhang, Kunshan (CN)

(72) Inventors: Yuming Zhang, Kunshan (CN); Ruihuan Zhang, Kunshan (CN)

( * ) Notice: Subject to any disclaimer, the term of this patent is extended or adjusted under 35 U.S.C. 154(b) by 0 days.

(21) Appl. No.: 17/657,123

(22) Filed: Mar. 29, 2022

(65) Prior Publication Data
US 2022/0235484 A1     Jul. 28, 2022

Related U.S. Application Data

(63) Continuation of application No. PCT/CN2020/114157, filed on Sep. 9, 2020.

(30) Foreign Application Priority Data

Sep. 29, 2019  (CN) .......................... 201910935348.2

(51) Int. Cl.
*C25D 17/12* (2006.01)
*C25D 7/00* (2006.01)
(Continued)

(52) U.S. Cl.
CPC .............. *C25D 17/12* (2013.01); *C25D 7/00* (2013.01); *C25D 21/12* (2013.01); *H05K 3/423* (2013.01); *H05K 2203/0723* (2013.01)

(58) Field of Classification Search
None
See application file for complete search history.

(56) References Cited

U.S. PATENT DOCUMENTS

| 8,221,611 B2 | 7/2012 | Van Den Bossche et al. |
| 2005/0067290 A1 | 3/2005 | Bonkass et al. |

(Continued)

FOREIGN PATENT DOCUMENTS

| CN | 1804147 A | 7/2006 |
| CN | 203256357 U | 10/2013 |

(Continued)

OTHER PUBLICATIONS

Kalita et al. (CN 104947172 A, machine translation) (Year: 2015).*
(Continued)

*Primary Examiner* — Wojciech Haske
(74) *Attorney, Agent, or Firm* — Getech Law LLC; Jun Ye

(57) ABSTRACT

The present disclosure is related to systems and methods for electrochemical process. The system may include a first electrode, a second electrode, an electric field distribution simulation optimizer, an electric field distribution controller, and a signal controller. The first electrode and the second electrode may form an electric field to change a substance on the second electrode. A morphology of the second electrode may be uneven. The first electrode may include an electrically conducting plate. A morphology of the electrically conducting plate may be in conformity with the morphology of the second electrode. A protruding portion of the electrically conducting plate may correspond to a recessing portion of the second electrode. A recessing portion of the electrically conducting plate may correspond to a protruding portion of the second electrode. The electric field distribution controller may be electrically connected to the signal controller and the electric field distribution simulation optimizer, respectively. The signal controller may be electrically connected to the electrically conducting plate. The signal (Continued)

controller may be configured to apply a processing signal to the electrically conducting plate.

20 Claims, 20 Drawing Sheets

(51) Int. Cl.
*C25D 21/12* (2006.01)
*H05K 3/42* (2006.01)

(56) References Cited

U.S. PATENT DOCUMENTS

| | | |
|---|---|---|
| 2007/0264566 A1 | 11/2007 | Arndt et al. |
| 2007/0295614 A1 | 12/2007 | Arndt et al. |
| 2009/0288954 A1* | 11/2009 | Van Den Bossche ... B23H 1/04 205/52 |
| 2015/0064450 A1 | 3/2015 | Sun et al. |

FOREIGN PATENT DOCUMENTS

| | | |
|---|---|---|
| CN | 104947172 A | 9/2015 |
| CN | 105655250 | 6/2016 |
| CN | 105734618 A | 7/2016 |
| CN | 106868574 A | 6/2017 |
| DE | 2443040 A1 | 2/1976 |
| DE | 10132408 C2 | 8/2003 |
| JP | S5014972 Y2 | 5/1975 |
| JP | S522841 A | 1/1977 |
| JP | H03285097 A | 12/1991 |
| JP | 2000045093 A | 2/2000 |
| TW | 201925544 4 | 7/2019 |

OTHER PUBLICATIONS

International Search Report in PCT/CN2020/114157 mailed on Dec. 11, 2020, 7 pages.
Written Opinion in PCT/CN2020/114157 mailed on Dec. 11, 2020, 10 pages.
The Partial Supplementary European Search Report in European Application No. 20867446.5 mailed on Sep. 6, 2023, 14 pages.
The Extended European Search Report in European Application No. 20667446.5 mailed on Dec. 12, 2023, 15 pages.

* cited by examiner

Obtaining, by an electric field distribution simulation optimizer, an optimized morphology of an anode and an optimized surface current distribution of the anode based on a morphology of a cathode after a previous optimization operation that is closer to an optimization target or an initial morphology of the cathode, a current morphology of the anode, a current surface current distribution of the anode, and a target morphology of the cathode ~ S2121

Controlling a distance between each needle head of a plurality of needle heads and an electrically insulating backplate based on the morphology of the anode, and controlling an electroplating signal applied to each electrically conducting unit of a plurality of electrically conducting units based on the surface current distribution of the anode; or
controlling each needle head of a plurality of needle heads and an electrically insulating backplate such that a distance between the each needle head of the plurality of needle heads and the electrically insulating backplate is the same, and controlling an electroplating signal applied to the each electrically conducting unit based on the surface current distribution of the anode; or
controlling a distance between each needle head of a plurality of needle heads and an electrically insulating backplate based on the morphology of the anode, and applying a same electroplating signal to the plurality of electrically conducting units ~ S220

FIG. 22

SYSTEMS AND METHODS FOR ELECTROCHEMICAL PROCESS

CROSS-REFERENCE TO RELATED APPLICATION

This application is a continuation of International Application No. PCT/CN2020/114157 field on Sep. 9, 2020, which claims priority of Chinese Patent Application No. 201910935348.2, filed on Sep. 29, 2019, the entire contents of which are hereby incorporated by reference.

TECHNICAL FIELD

This disclosure generally relates to electrochemical techniques, and more particularly, relates to systems and methods for electrochemical process.

BACKGROUND

At present, most challenging features of a printed circuit board are as follows: 1. a thickness of a board is equal to or greater than 10 cm; 2. a size of the board is equal to or greater than 120 cm×120 cm; 3. a depth-to-width ratio of a via on the board is 15:1, or higher than 20:1; 4. densely arranged via arrays and sparsely distributed vias coexist, and the vias have different depth-to-width ratios. The requirements or expectations in terms of the quality of PCBs by high-end PCB manufacturers and their clients may include: 1. a deposition thickness of copper in the via satisfies a required thickness, and the deposition thickness of copper on the surface is not too thick; 2. the deposition of copper in a through via achieves a shape of "X", or the through via is filled with copper; 3. the deposition of copper on the surface is uniform.

Comparisons of various manufacturing techniques and processes in related arts:

| Related technologies and processes | Problems that can be solved | Problems that cannot be solved or existing problems |
|---|---|---|
| Small current density conformal electroplating method | The deposition thickness of copper in the via can satisfy a required thickness | A. The deposition of copper cannot fill the through via, a "slit" is usually exist in the through via; B. The deposition of copper on the surface is too thick; C. Time consuming and low yield. |
| Electroplating method for applying positive and negative pulse power sources to a $Fe^{2+}/Fe^{3+}$ electrolyte system | Step one, using a conformal electroplating; Step two, using a suitable positive and negative pulse to increase the thickness of the copper in the center of the via, and etching away the copper on the surface exploiting the oxidizing property of $Fe^{3+}$ to reduce the thickness of the copper on the surface. The deposition of copper in the through via with a moderate depth-to-width ratio achieves a shape of "X", or the through via is filled with copper. | A. A certain degree of over-electroplating still exists on the surface; B. When there are both densely arranged via arrays and sparsely distributed vias on the surface, and/or the vias have different depth-to-width ratios, the uniformity and thickness requirements of the copper on the surface, and the thickness and shape requirements of the copper in the via cannot be achieved simultaneously. |

In summary, the challenge in preparing a PCB includes that the related techniques cannot simultaneously satisfy following performance requirements: 1. the deposition thickness of copper in the via satisfies a required thickness; 2. the deposition thickness of copper on the surface is not too thick; 3. the deposition of copper in the through via achieves a shape of "X", or the through via is filled with copper; and the deposition of copper on the surface is uniform.

SUMMARY

The embodiments of present disclosure provide an electroplating anode and an electroplating method using the electroplating anode, to achieve a uniform electroplating on the surface of the cathode, or a local electroplating enhancement on the surface of the cathode.

According to a first aspect of the present disclosure, the embodiments of the present disclosure may provide an electroplating anode. The electroplating anode and a cathode to be electroplated may form an electric field to deposit an electroplating layer on a surface of the cathode. A morphology of the cathode may be uneven. The electroplating anode may include an electrically conducting plate. A morphology of the electrically conducting plate may be in conformity with the morphology of the cathode. A protruding portion of the electrically conducting plate may correspond to a recessing portion of the cathode, and a recessing portion of the electrically conducting plate may correspond to a protruding portion of the cathode.

According to a second aspect of the present disclosure, the embodiments of the present disclosure may provide an electroplating anode. The electroplating anode and a cathode to be electroplated may form an electric field to deposit an electroplating layer on a surface of the cathode. A morphology of the cathode may be uneven. The electroplating anode may include an electrically insulating backplate and a plurality of electrically conducting units. Each of the plurality of electrically conducting units may include a needle rod and a needle head that is configured at an end of the needle rod. The end of the needle rod with the needle head may be configured as an electroplating end of the electrically conducting unit. The electrically conducting unit may be fixed on the electrically insulating backplate by the needle rod. The plurality of electrically conducting units may be arranged in an array. Any two of the plurality of electrically conducting units may be electrically insulated from each other.

According to a third aspect of the present disclosure, the embodiments of the present disclosure may provide an electroplating method using the electroplating anode of the first aspect of the present disclosure. The electroplating anode and a cathode to be electroplated may form an electric field to deposit an electroplating layer on a surface of the cathode. A morphology of the cathode may be uneven. The electroplating anode may include an electrically conducting plate. A morphology of the electrically conducting plate may be in conformity with the morphology of the cathode. A protruding portion of the electrically conducting plate may correspond to a recessing portion of the cathode, and a recessing portion of the electrically conducting plate may correspond to a protruding portion of the cathode. The electroplating method may include: obtaining a morphology of the anode based on a target morphology of the cathode; preparing a mold substrate based on the morphology of the anode, wherein a morphology of a side of the mold substrate may be in conformity with the morphology of the cathode, a protruding portion on the side of the mold substrate may correspond to the recessing portion of the cathode, and a recessing portion on the side of the mold substrate may correspond to the protruding portion in the cathode; preparing the electroplating anode based on the mold substrate; and applying an electroplating signal (also referred to as a processing signal) to the electroplating anode.

According to a fourth aspect of the present disclosure, the embodiments of the present disclosure may provide an electroplating method using the electroplating anode of the second aspect of the present disclosure. The electroplating anode and a cathode to be electroplated may form an electric field to deposit an electroplating layer on a surface of the cathode. The morphology of the cathode may be uneven. The electroplating anode may include an electrically insulating backplate and a plurality of electrically conducting units. Each of the plurality of electrically conducting units may include a needle rod and a needle head that is configured at an end of the needle rod. The end of the needle rod with the needle head may be configured as an electroplating end of the electrically conducting unit. The electrically conducting unit may be fixed on the electrically insulating backplate by the needle rod. The plurality of electrically conducting units may be arranged in an array. Any two of the plurality of electrically conducting units may be electrically insulated from each other. The electroplating method may include: obtaining a morphology of the anode and a surface current distribution of the anode based on a morphology of the cathode; controlling a distance between each needle head of a plurality of needle heads and the electrically insulating backplate based on the morphology of the anode, and controlling an electroplating signal applied to the each electrically conducting unit of the plurality of electrically conducting units based on the surface current distribution of the anode; or controlling each needle head of a plurality of needle heads and the electrically insulating backplate such that the distance between the each needle head of the plurality of needle heads and the electrically insulating backplate is the same, and controlling an electroplating signal applied to the each electrically conducting unit based on the surface current distribution of the anode; or controlling a distance between each needle head of a plurality of needle heads and the electrically insulating backplate based on the morphology of the anode, and applying a same electroplating signal to the plurality of electrically conducting units.

According to a fifth aspect of the present disclosure, the present disclosure may provide an electroplating device including a first electroplating anode, a second electroplating anode and a cathode. The first electroplating anode and the second electroplating anode may include an electroplating anode. The cathode may include a first surface and a second surface. A morphology of the first electroplating anode may be in conformity with a morphology of the first surface of the cathode. A morphology of the second electroplating anode may be in conformity with a morphology of the second surface of the cathode. The first electroplating anode may oppose the first surface of the cathode. The first electroplating anode and the cathode may form an electric field to deposit an electroplating layer on the first surface of the cathode. The second electroplating anode may oppose the second surface of the cathode. The second electroplating anode and the cathode may form another electric field to deposit another electroplating layer on the second surface of the cathode.

According to a sixth aspect of the present disclosure, the present disclosure may provide a system for electrochemical process. The system may include a first electrode, a second electrode, an electric field distribution simulation optimizer, an electric field distribution controller, and a signal controller. A morphology of the second electrode may be uneven. The first electrode may include an electrically conducting plate. A morphology of the electrically conducting plate may be in conformity with the morphology of the second electrode. A protruding portion of the electrically conducting plate may correspond to a recessing portion of the second electrode. A recessing portion of the electrically conducting plate may correspond to a protruding portion of the second electrode. The electric field distribution controller may be electrically connected to the signal controller and the electric field distribution simulation optimizer, respectively. The signal controller may be electrically connected to the electrically conducting plate. The signal controller may be configured to apply a processing signal to the electrically conducting plate.

According to a seventh aspect of the present disclosure, the present disclosure may provide a system for electrochemical process. The system may include a first electrode and a second electrode. A morphology of the second electrode may be uneven. The first electrode may include an electrically insulating backplate and a plurality of electrically conducting units. Each of the plurality of electrically conducting units may include a needle rod and a needle head that is configured at an end of the needle rod. The end of the needle rod with the needle head may be configured as a functioning end of the electrically conducting unit. The electrically conducting unit may be supported by the electrically insulating backplate via the needle rod. The plurality of electrically conducting units may be arranged in an array. Any two of the plurality of electrically conducting units are electrically insulated from each other.

According to an eighth aspect of the present disclosure, the present disclosure may provide a method for electrochemical process using an electrochemical device. The electrochemical device may include a first electrode and a second electrode. A morphology of the second electrode may be even. The first electrode may include an electrically conducting plate. A morphology of the electrically conducting plate may be in conformity with the morphology of the second electrode. A protruding portion of the electrically conducting plate may correspond to a recessing portion of the second electrode. A recessing portion of the electrically conducting plate may correspond to a protruding portion of the second electrode. The method may include obtaining a morphology of the first electrode based on a target morphology of the second electrode. The target morphology of the second electrode may be an optimization target. The method may include preparing a mold substrate based on the morphology of the first electrode. A morphology of a side of the mold substrate may be in conformity with the morphology of the second electrode. A protruding portion on the side of the mold substrate may correspond to the recessing portion of the second electrode. A recessing portion on the side of the mold substrate may correspond to the protruding portion in the second electrode. The method may include preparing the first electrode based on the mold substrate. The method may include applying a processing signal to the first electrode.

BRIEF DESCRIPTION OF THE DRAWINGS

FIG. 22 is a flowchart diagram illustrating an electroplating method using an electroplating anode according to some embodiments of the present disclosure;

DETAILED DESCRIPTION

Figure 1A:
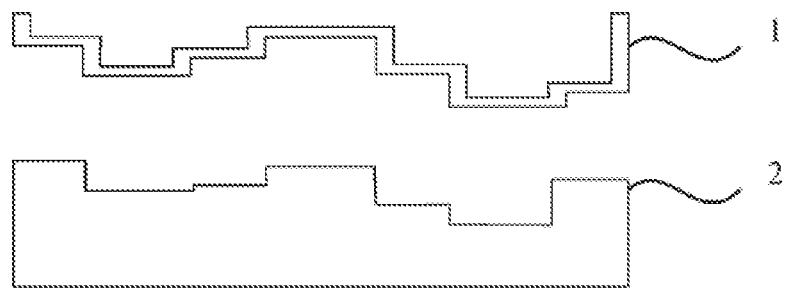
FIG. 1A is a structural schematic diagram illustrating an electroplating anode according to some embodiments of the present disclosure.

In some embodiments, an electrochemical system (or an electrochemical device) may include a first electrode and a second electrode. In some embodiments, the first electrode may be an anode, and the second electrode may be a cathode to be electroplated. The anode and the cathode to be electroplated may form an electric field to deposit an electroplating layer on a surface of the cathode. In some embodiments, the first electrode may be a cathode, and the second electrode may be an anode to be etched. The cathode and the anode to be etched may form an electric field to etch a surface of the anode. For illustration purposes, the following description is provided to help better understanding an electroplating process. It is understood that this is not intended to limit the scope of the present disclosure. For example, the descriptions with reference to an electroplating anode in an electroplating process in the present disclosure may be applicable to a cathode in an electrochemical etching process, and/or the descriptions with reference to a cathode in an electroplating process in the present disclosure may be applicable to an anode in an electrochemical etching process.

Electroplating (i.e., electrochemical deposition of metals) is a critical operation in advanced packaging. The core technology of the packaging technology (e.g., 3D packaging technology, 2.5D packaging technology, fan-out wafer level packaging technology, fan-out panel-level packaging technology, flip chip technology) is the horizontal and vertical electrical connection of functional modules stacked with high spatial density. The horizontal electrical connection methods may include a redistribution layer (RDL) method. The vertical electrical connection method may include a copper pillars method and a through via filling with copper method. The electrical connections may be achieved by an electroplating process. The integration of the functional modules becomes higher, the line width and line spacing of the functional modules become smaller, the via diameter of the functional modules becomes smaller, and the via depth of the functional modules becomes deeper, which poses a great challenge to the electroplating technology.

Researchers have found that, in related arts, a flat plate-shaped or mesh-shaped electroplating anode is usually used to form an electric field with a cathode to be electroplated to deposit metal on a surface of the cathode. Since a morphology of the cathode is uneven, an electric field formed by a protruding portion of the cathode and the electroplating anode may be different from an electric field formed by a recessing portion of the cathode and the electroplating anode, resulting in an ununiform electroplating layer on the surface of the cathode. In some embodiments, the cathode to be electroplated may be, for example, a printed circuit board. The morphology of the cathode may be, for example, the surface morphology of one side of the printed circuit board, or two sides of the printed circuit board. In some embodiments, the cathode to be electroplated may be a wafer (or a hardware). The morphology of the cathode may be the surface morphology of one side of the wafer, or two sides of the wafer. In some embodiments, the cathode to be electroplated may be a hardware. The morphology of the cathode may be the surface morphology of at least one side of the hardware.

In order to avoid the above situations, the present disclosure proposes a plurality of embodiments under a general application idea. The general application idea may be that changing the morphology of the anode and/or electroplating signals corresponding to a plurality of portions of the electroplating anode based on the morphology of the cathode, such that the surface of the cathode can be electroplated uniformly, or the local electroplating of the surface of the cathode can be strengthened.

It should be noted that, in the present disclosure, the morphology of the anode (the morphology of the electroplating anode) may be the morphology of the electrically conducting plate, or the morphology represented by needle heads of a plurality of electrically conducting units. Similarly, a surface current distribution of the anode (a surface current distribution of the electroplating anode) may be a surface current distribution of the electrically conducting plate, or an effective surface current distribution represented by surface current distributions of the needle heads of the plurality of electrically conducting units.

FIG. 1A is a structural schematic diagram illustrating an electroplating anode according to some embodiments of the present disclosure. Referring to FIG. 1A, an electroplating anode 1 and a cathode 2 to be electroplated may form an electric field to deposit an electroplating layer on a surface of the cathode 2 (in FIG. 1A, take an uneven surface of the cathode 2 as an example for illustration). A morphology of the cathode 2 may be uneven. The electroplating anode 1 may include an electrically conducting plate. A morphology of the electrically conducting plate may be in conformity with or approximately in conformity with the morphology of the cathode 2. A protruding portion of the electrically conducting plate may correspond to a recessing portion of the cathode 2. A recessing portion of the electrically conducting plate may correspond to a protruding portion of the cathode 2. In FIG. 1A, for example, the morphology of the electrically conducting plate may be presented by a broken line. In practical applications, the morphology of the electrically conducting plate may be configured according to an actual production need reasonably, which is not limited herein.

Figure 1B:
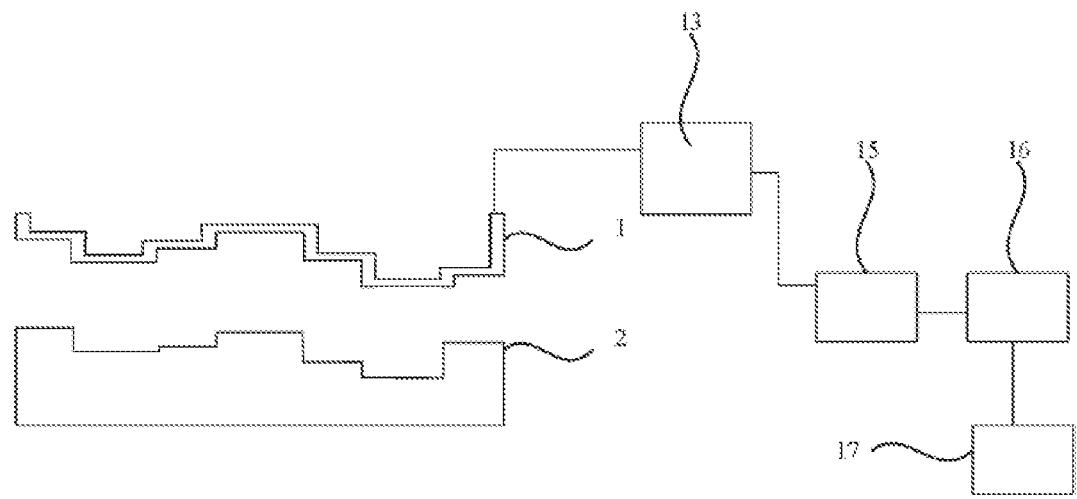
FIG. 1B is a structural schematic diagram illustrating an electroplating anode according to some embodiments of the present disclosure.

In some embodiments, referring to FIG. 1B, the electroplating anode 1 may further include a surface morphology detector 17, an electric field distribution simulation optimizer 16, an electric field distribution controller 15, and a signal controller 13. An input end of the electric field distribution simulation optimizer 16 may be electrically connected to the surface morphology detector 17. An output end of the electric field distribution simulation optimizer 16 may be electrically connected to the electric field distribution controller 15. The electric field distribution controller 15 may be electrically connected to the signal controller 13. The signal controller 13 may be electrically connected to the electrically conducting plate. The signal controller 13 may be configured to apply an electroplating signal (also referred to as a processing signal) to the electrically conducting plate.

Before an electroplating process starts, the electric field distribution simulation optimizer 16 may be configured to obtain initial morphological information of the cathode from the surface morphology detector 17; simulate the electric field between the electroplating anode 1 and the cathode 2, and a deposition of an electroplating substance on the cathode 2 based on the initial morphological information of the cathode, initial morphological information of the anode, and an initial surface current distribution of the anode; determine the morphology of the electroplating anode 1 (i.e., the morphology of the electrically conducting plate in FIG. 1A, the morphology of the electrically conducting plate cannot be changed once the morphology of the electrically conducting plate is formed) and an optimized surface current distribution of the anode using an optimization algorithm and according to an optimization target including a distribution and a thickness of the electroplating substance on a surface of the cathode; and transmit information of the optimized surface current distribution of the anode to electric field distribution controller 15. The electric field distribution controller 15 may control the electroplating signal that is output by signal controller 13 to the electrically conducting plate.

During the electroplating process, the electric field distribution simulation optimizer 16 may be configured to (1) obtain real-time morphological information of the cathode from the surface morphology detector 17; (2) simulate the electric field between the electroplating anode 1 and the cathode 2 and the deposition of the electroplating substance on the cathode 2 based on the real-time morphological information of the cathode, the morphology of the electrically conducting plate, and a current surface current distribution of the anode; (3) determine a further optimized surface current distribution of the anode according to the optimization target using the optimization algorithm; and (4) transmit information of the further optimized surface current distribution of the anode to the electric field distribution controller 15. The electric field distribution controller 15 may (5) control the electroplating signal that is output by the signal controller 13 to the electrically conducting plate. During the electroplating process, the electric field distribution simulation optimizer 16 and the electric field distribution controller 15 may repeat the operations (1)-(5) until the morphology of the cathode 2 satisfies the optimization target, or a difference between the morphology of the cathode 2 and the optimization target reaches a preset value.

It should be noted that, in the present disclosure, the surface morphology detector 17 may scan the morphological information of the cathode 2 via a non-contact method, such as X-rays, y-rays, ultrasound, light, electromagnetic waves, or the like, to obtain a 3D image of the cathode 2.

Figure 1C:
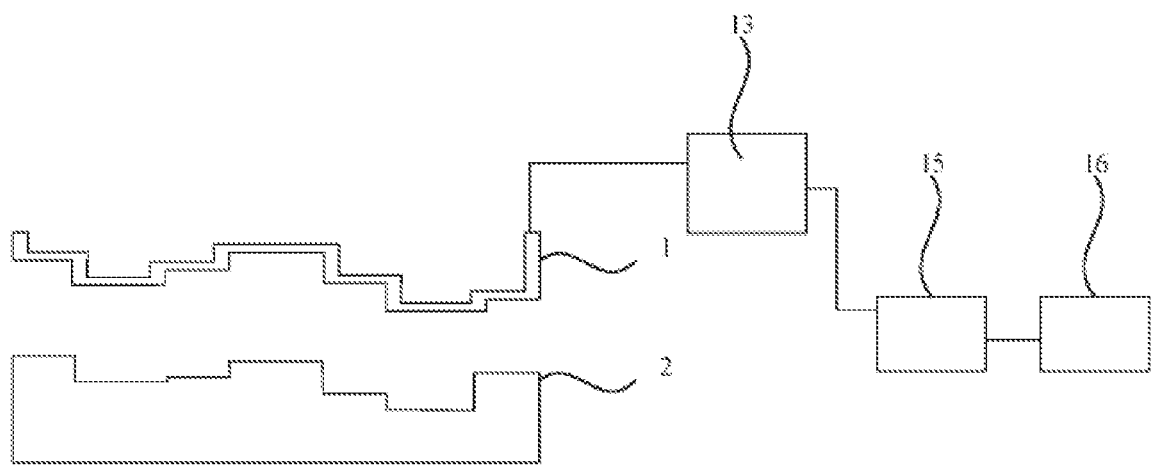
FIG. 1C is a structural schematic diagram illustrating an electroplating anode according to some embodiments of the present disclosure.

In some embodiments, referring to FIG. 1C, the electroplating anode 1 may include the electric field distribution simulation optimizer 16, the electric field distribution controller 15, and the signal controller 13.

The electric field distribution controller 15 may be electrically connected to the signal controller 13 and the electric field distribution simulation optimizer 16, respectively. The signal controller 13 may be electrically connected to the electrically conducting plate. The signal controller 13 may be configured to apply an electroplating signal to the electrically conducting plate.

Before an electroplating process starts, the electric field distribution simulation optimizer 16 may be configured to simulate the electric field between the electroplating anode 1 and the cathode 2 and a deposition of an electroplating substance on the cathode 2 based on input initial morphological information of the cathode, an initial morphology of the anode, and an initial surface current distribution of the anode; determine, using an optimization algorithm and according to an optimization target including a distribution and a thickness of the electroplating substance on a surface of the cathode 2, the morphology of the electroplating anode 1 (i.e., the morphology of the electrically conducting plate in FIG. 1A, the morphology of the electrically conducting plate cannot be changed once the morphology of the electrically conducting plate is formed) and an optimized surface current distribution of the anode; and transmit information of the optimized surface current distribution of the anode to the electric field distribution controller 15. The electric field distribution controller 15 may control the electroplating signal that is output by the signal controller 13 to the electrically conducting plate.

In some embodiments, referring to FIG. 1C, the electroplating anode 1 may include the electric field distribution simulation optimizer 16, the electric field distribution controller 15, and the signal controller 13.

The electric field distribution controller 15 may be electrically connected to the signal controller 13 and the electric field distribution simulation optimizer 16, respectively. The signal controller 13 may be electrically connected to the electrically conducting plate. The signal controller 13 may be configured to apply an electroplating signal to the electrically conducting plate.

Before an electroplating process starts, the electric field distribution simulation optimizer 16 may be configured to simulate the electric field between the electroplating anode 1 and the cathode 2, and a deposition of an electroplating substance on the cathode 2 based on input initial morphological information of the cathode, initial morphological information of the anode, and an initial surface current distribution of the anode; determine the morphology of the electroplating anode 1 (i.e., the morphology of the electrically conducting plate in FIG. 1A, the morphology of the electrically conducting plate cannot be changed once the morphology of the electrically conducting plate is formed) and an optimized surface current distribution of the anode using an optimization algorithm and according to an optimization target including a distribution and a thickness of the electroplating substance on a surface of the cathode 2; and obtain the morphology of the cathode after a current optimization operation that is closer to the optimization target; and transmit information of the optimized surface current distribution of the anode to the electric field distribution controller 15. The electric field distribution controller 15 may control the electroplating signal that is output by the signal controller 13 to the electrically conducting plate. During the electroplating process, the electric field distribution simulation optimizer 16 may be configured to (1) simulate the electric field between the electroplating anode 1 and the cathode 2, and the deposition of the electroplating substance on the cathode 2 based on the morphology of the cathode after a previous optimization operation that is closer to the optimization target, the morphology of the electrically conducting plate, and the current surface current distribution of the anode; (2) determine a further optimized surface current distribution of the anode according to the optimization target and using the optimization algorithm; (3) obtain the morphology of the cathode after a current optimization operation that is closer to the optimization target; and (4) transmit the information of the further optimized surface current distribution of the anode to the electric field distribution controller 15. The electric field distribution controller 15 may (5) control the electroplating signal that is output by the signal controller 13 to the electrically conducting plate. During the electroplating process, the electric field distribution simulation optimizer 16 and the electric field distribution controller 15 may repeat the operations (1)-(5) until the morphology of the cathode 2 satisfies the optimization target, or a difference between the morphology of the cathode 2 and the optimization target reaches a preset value.

In some embodiments of the present disclosure, the morphology of the anode may be changed according to the morphology of the cathode, such that the morphology of the electroplating anode is in conformity with or approximately in conformity with the morphology of the cathode. That is, the protruding portion of the electroplating anode may correspond to the recessing portion of the cathode, and the recessing portion of the electroplating anode may correspond to the protruding portion of the cathode. Therefore, the electric field formed by each portion of the cathode and the electroplating anode may be the same or approximately the same, the surface of the cathode may be electroplated uniformly, or the local electroplating of the surface of the cathode may be strengthened.

Figure 2:
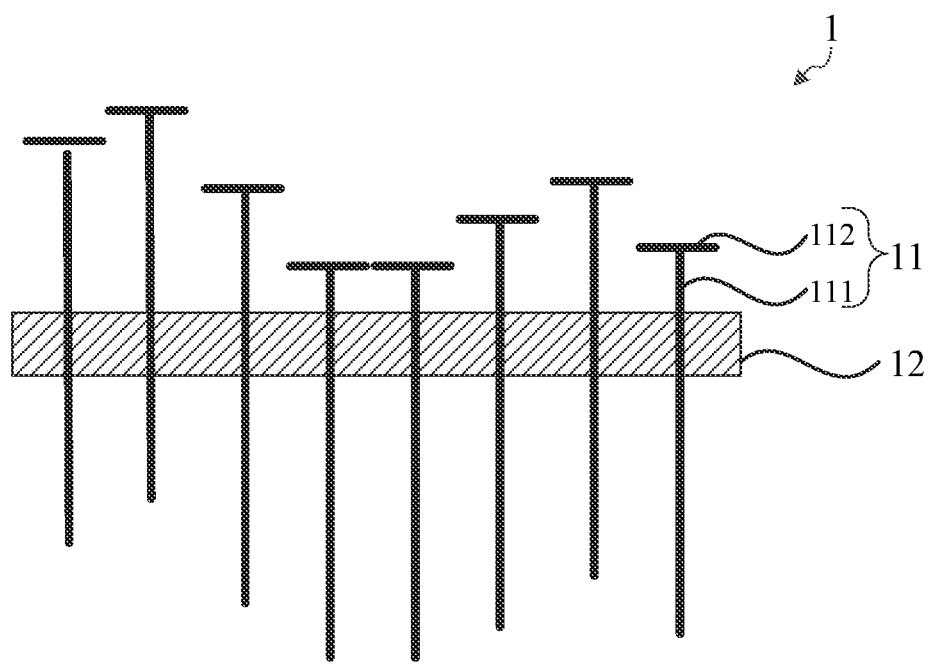
FIG. 2 is a structural schematic diagram illustrating an electroplating anode according to some embodiments of the present disclosure.
Figure 3:
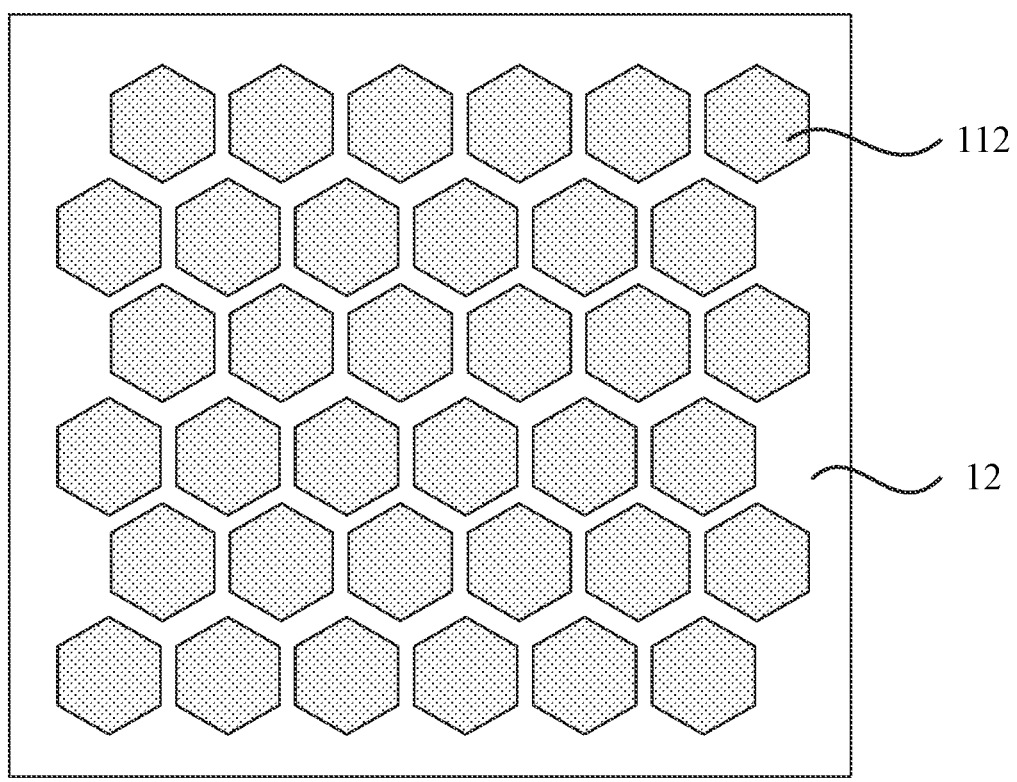
FIG. 3 is a top view structural schematic diagram illustrating the electroplating anode in FIG. 2.

FIG. 2 is a structural schematic diagram illustrating an electroplating anode according to some embodiments of the present disclosure. FIG. 3 is a top view structural schematic diagram illustrating the electroplating anode in FIG. 2. Referring to FIG. 2 and FIG. 3, the electroplating anode 1 and the cathode 2 to be electroplated may form an electric field to deposit an electroplating layer on the surface of cathode 2. The morphology of cathode 2 may be uneven. The electroplating anode 1 may include an electrically insulating backplate 12 and a plurality of electrically conducting units 11. Each electrically conducting unit of the plurality of electrically conducting units 11 may include a needle rod 111 and a needle head 112 configured at one end of the needle rod 111. The end of the needle rod 111 with the needle head 112 may be configured as an electroplating end of the electrically conducting unit 11. The needle head 112 of the electrically conducting unit 11 and the cathode 2 may form an electric field to deposit metal ions in the electroplating solution on the surface of the cathode, such that the cathode 2 is electroplated. For example, a copper layer may be electroplated on a printed circuit board. The electrically conducting unit 11 may be supported by the electrically insulating backplate 12 via the needle rod 111. The plurality of electrically conducting units 11 may be arranged in an array. Any two of the plurality of electrically conducting units 11 may be electrically insulated from each other.

In some embodiments of the present disclosure, the electroplating anode may be discretized into a plurality of electrically conducting units that are not in contact with each other. That is, a continuous large surface may be discretized into a plurality of small surfaces, such that the morphology of the anode can be changed by changing a distance between the needle head and the cathode. The electroplating signal of each "small surface" of the electroplating anode may be changed by changing an intensity or a pattern of the electroplating signal applied to the electrically conducting unit. The morphology of the anode and/or the electroplating signal of each "small surface" of the electroplating anode may be changed based on the morphology of the cathode. Therefore, the surface of the cathode may be electroplated uniformly, or the local electroplating of the surface of the cathode may be strengthened. The electroplating signal may include a current, a voltage, a power, a direct current, or a pulse current.

The embodiments of the present disclosure may at least achieve following beneficial effects: 1. in a via with a depth-to-width ratio of 15:1 or greater than 20:1, an electric field distribution in the via or a current distribution on a surface of an inner wall of the via can be precisely controlled, a thickness of an electroplating substance on the surface of the inner wall of the via can be controlled, and the via can be filled with the electroplating substance (e.g., copper); 2. a size of the electroplating anode is 120 cm×120 cm, a surface electric field distribution or a surface current distribution of the electroplating anode can be accurately controlled, the electroplating substance can be distributed on the surface of the cathode uniformly, and the thickness of the electroplating substance on the surface of the cathode can be controlled; 3. the time for electroplating is relatively short.

In some embodiments, referring to FIG. 3, a shape of a vertical projection of the needle head 112 on the electrically insulating backplate 12 may be a regular hexagon. The plurality of needle heads 112 may be arranged in an array. The plurality of needle heads 112 may be sequentially arranged in a row, and the needle heads 112 in two adjacent rows may be arranged in a staggered manner. In some embodiments, the shape of the vertical projection of the needle head 112 on the electrically insulating backplate 12 may be a square, a rectangle, a circle, or an ellipse, which is not limited herein.

Figure 4:
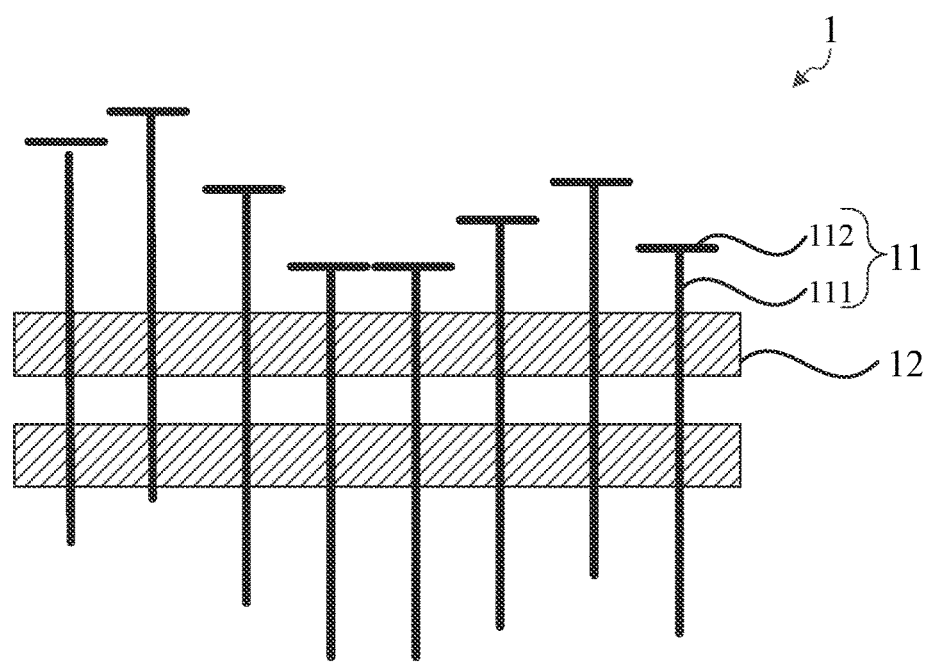
FIG. 4 is a structural schematic diagram illustrating an electroplating anode according to some embodiments of the present disclosure.

FIG. 4 is a structural schematic diagram illustrating an electroplating anode according to some embodiments of the present disclosure. Referring to FIG. 4, the electroplating anode 1 may include two electrically insulating backplates 12. The needle rod 111 may penetrate the two insulating backplates 12. By using the two insulating backplates 12, the firmness between the insulating backplates 12 and the needle rod 111 may be increased, the needle rod 111 may not be easy to shake, the position of the needle head 112 and the electric field between the needle head 112 and the cathode 2 may be controlled accurately, which may improve the electroplating effect of the cathode 2.

Figure 5:
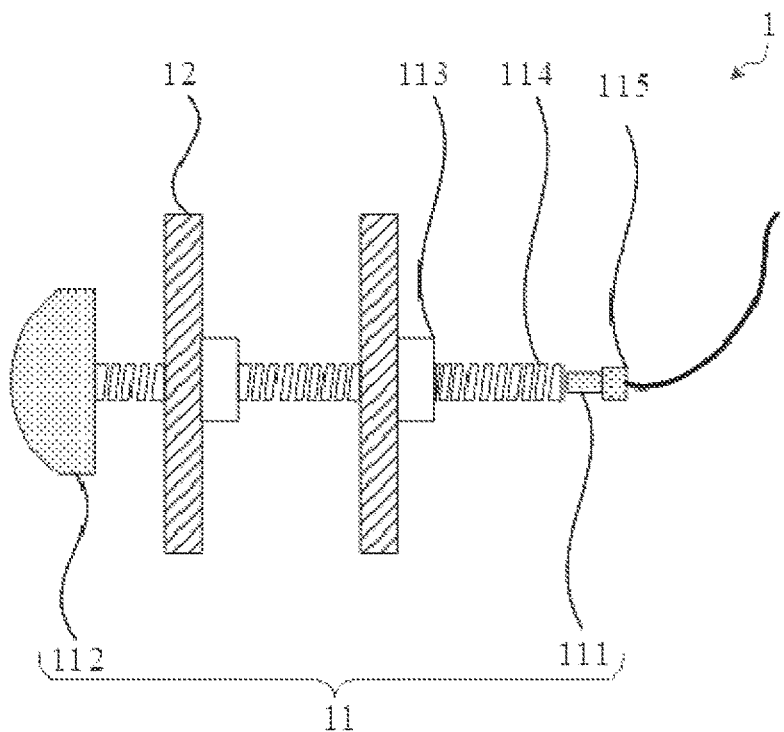
FIG. 5 is a structural schematic diagram illustrating an electroplating anode according to some embodiments of the present disclosure.

FIG. 5 is a structural schematic diagram illustrating an electroplating anode according to some embodiments of the present disclosure. Referring to FIG. 5, a surface of the needle head 112 facing away from the electrically insulating backplate 12 may be a convex surface that bulges toward a direction away from the electrically insulating backplate 12. In some embodiments of the present disclosure, by using the needle head 112 with the convex surface, a surface area of the electroplating anode may be increased. In some embodiments, the surface of the needle head 112 facing away from the electrically insulating backplate 12 may have any other shapes.

Figure 6:
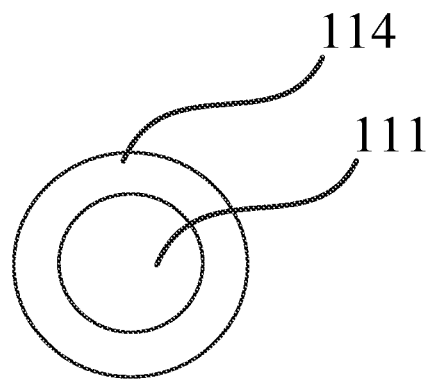
FIG. 6 is a top view structural diagram illustrating a part of the electroplating anode in FIG. 5.

FIG. 6 is a top view structural diagram illustrating a part of the electroplating anode in FIG. 5. Referring to FIG. 5 and FIG. 6, the electroplating anode 1 may include an electrically insulating thread 114 and an electrically insulating nut 113. The electrically insulating nut 113 may be fixed on the electrically insulating backplate 12. The insulating thread 114 may be disposed on the needle rod 111. The electrically insulating thread 114 may be engaged with the electrically insulating nut 113. In some embodiments of the present disclosure, the distance between each needle head 112 and the electrically insulating backplate 12, and the distance between the each needle head 112 and the cathode 2 may be controlled by rotating the electrically insulating thread 114 in the electrically insulating nut 113.

In some embodiments, referring to FIG. 5, the electroplating anode 1 may include a wiring terminal 115. The wiring terminal 115 may be configured at an end of the needle rod 111 away from the needle head 112. The needle rod 111 of the electrically conducting unit 11 and the needle head 112 may be electrically connected with the feeder via the wiring terminal 115 electrically connected with the needle rod 111.

Figure 7:
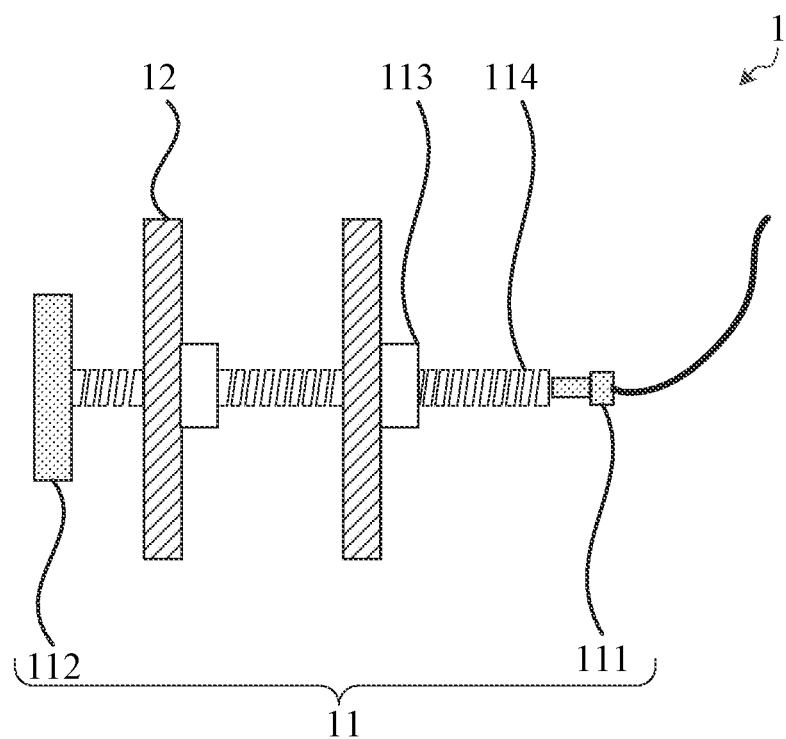
FIG. 7 is a structural schematic diagram illustrating an electroplating anode according to some embodiments of the present disclosure.

FIG. 7 is a structural schematic diagram illustrating an electroplating anode according to some embodiments of the present disclosure. Referring to FIG. 7, a surface of the needle head 112 facing away from the electrically insulating backplate 12 may be a flat surface. Since the surface of the needle head 112 is flat, the needle head 112 and the cathode 2 may form a uniform local electric field, the difficulty of the installation of the electrically conducting unit 11 may be reduced and the cost may also be reduced.

Figure 8:
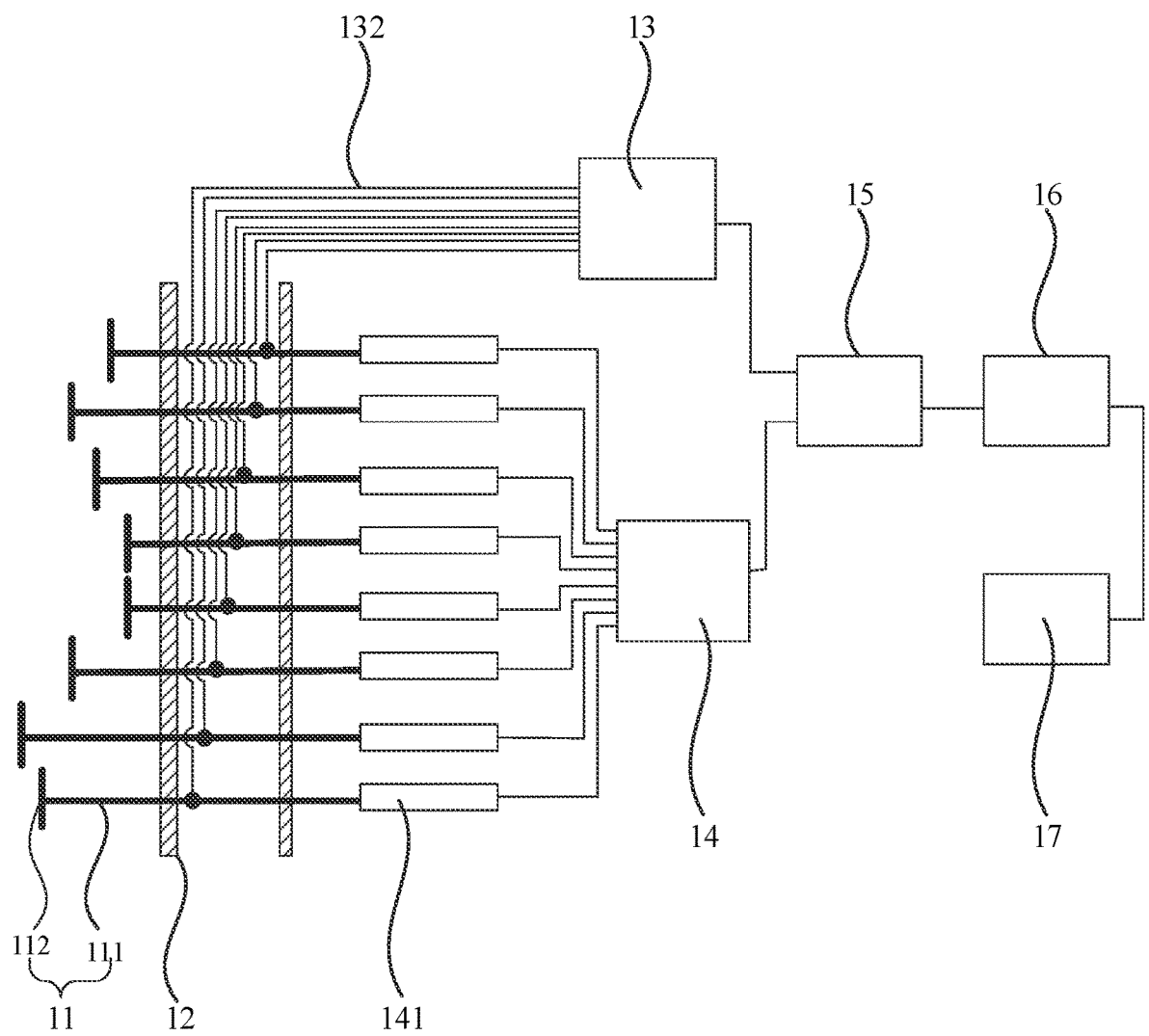
FIG. 8 is a structural schematic diagram illustrating an electroplating anode according to some embodiments of the present disclosure.

FIG. 8 is a structural schematic diagram illustrating an electroplating anode according to some embodiments of the present disclosure. Referring to FIG. 8, the electroplating anode 1 may include the signal controller 13 and a plurality of feeders 132. Each of the plurality of electrically conducting units 11 may be electrically connected to the signal controller 13 via one of the plurality of feeders 132. The signal controller may be configured to apply an electroplating signal to the electrically conducting unit 11.

Figure 9:
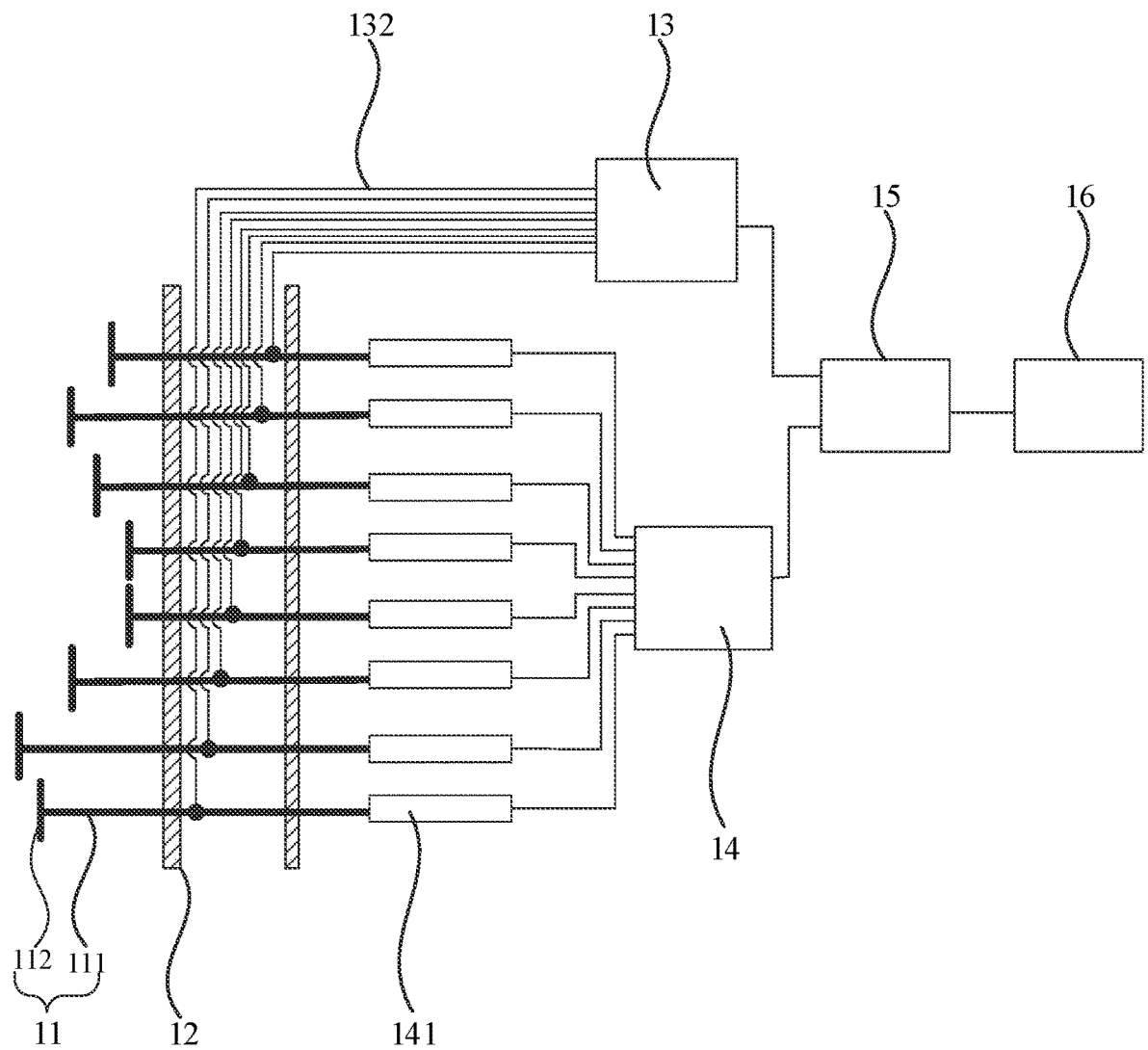
FIG. 9 is a structural schematic diagram illustrating an electroplating anode according to some embodiments of the present disclosure.

In some embodiments, referring to FIG. 8 and FIG. 9, the electroplating anode 1 may include a driver controller 14 and a plurality of drivers 141. The electric field distribution controller 15 may be electrically connected to the driver controller 14. The drive controller 14 may be electrically connected to the plurality of drivers 141. Each of the plurality of drivers 141 may be connected to an end of the corresponding needle rod 111 that is away from the needle head 112. The electric field distribution controller 15 may control a driving signal that is output by the controller 14 to the driver 141. Each of the plurality of drivers 141 may be configured to control the distance between the needle head 112 and the electrically insulating backplate 12, thereby adjusting the morphology of the electroplating anode, and controlling the distance between needle head 112 and the cathode 2.

In some embodiments, referring to FIG. 8, the electroplating anode 1 may include two electrically insulating backplates 12. The needle rod 111 may penetrate the two electrically insulating backplates 12. The needle rod 111 may move in a direction perpendicular to the electrically insulating backplate 12, but cannot move in other directions. An electrical connection between the feeder 132 and the electrically conducting unit 11 may be located between the two electrically insulating backplates 12. In some embodiments of the present disclosure, on the one hand, the electrical connection between the feeder 132 and the electrically conducting unit 11 may be located between the two electrically insulating backplates 12, and the two electrically insulating backplates 12 can be used to protect the feeder 132. On the other hand, the electrical connection between the feeder 132 and the electrically conducting unit 11 may be located between the two electrically insulating backplates 12, the electrical connection between the feeder 132 and the electrically conducting unit 11 can utilize the space between the two electrically insulating backplates 12, and does not occupy the space other than the two electrically insulating backplates 12, the space utilization rate may be increased, and the integration of the components of the electroplating anode 1 may be improved.

In some embodiments, the electroplating anode 1 may include only one electrically insulating backplate 12. The needle rod 111 may penetrate the electrically insulating backplate 12. The needle rod 111 may move in a direction perpendicular to the electrically insulating backplate 12, but cannot move in other directions.

In some embodiments, referring to FIG. 8, the electroplating anode 1 may include the surface morphology detector 17, the electric field distribution simulation optimizer 16, and the electric field distribution controller 15. The input end of the electric field distribution simulation optimizer 16 may be electrically connected to the surface morphology detector 17. The output end of the electric field distribution simulation optimizer 16 may be electrically connected to the electric field distribution controller 15. The electric field distribution controller 15 may be electrically connected to the signal controller 13. The electric field distribution controller 15 may be electrically connected to the driver controller 14. At an initial stage of an electroplating process, the electric field distribution simulation optimizer 16 may be configured to obtain initial morphological information of the cathode from the surface morphology detector 17; simulate an electric field between the electroplating anode and the cathode and a deposition of an electroplating substance on the cathode based on the initial morphology information of the cathode, an initial morphology of the anode, and an initial surface current distribution of the anode; determine an optimized morphology of the anode and an optimized surface current distribution of the anode using an optimization algorithm and according to an optimization target (a target morphology of the cathode) including a distribution and a thickness of the electroplating substance on a surface of the cathode; and transmit information of the optimized morphology of the anode and the optimized surface current distribution of the anode to the electric field distribution controller 15. The electric field distribution controller 15 may control an electroplating signal that is output by the signal controller 13 to each of the plurality of electrically conducting units 11. The electric field distribution controller 15 may control the driver controller 14 to transmit, to each of the plurality of drivers 141, different control signals each of which specifies an extension distance or a retraction distance of one needle rod 111 for adjusting the morphology of the anode. During the electroplating process, the electric field distribution simulation optimizer 16 may be configured to (1) obtain real-time morphological information of the cathode from the surface morphology detector 17; (2) simulate an electric field between the electroplating anode and the cathode and the deposition of the electroplating substance on the cathode based on the real-time morphological information of the cathode, a current morphology of the anode, and a current surface current distribution of the anode; (3) determine a further optimized morphology of the anode and a further optimized surface current distribution of the anode according to the optimization target using the optimizing algorithm; and (4) transmit information of the further optimized morphology of the anode and the further optimized surface current distribution of the anode to the electric field distribution controller 15. The electric field distribution controller 15 may (5) control the electroplating signal that is output by the signal controller 13 to each of the plurality of electrically conducting units 11. The electric field distribution controller 15 may (6) control the drive controller 14 to transmit, to each of the plurality of drivers 141, different control signals each of which specifies an extension distance or a retraction distance of one needle rod 111 for adjusting the morphology of the anode. During the electroplating process, the electric field distribution simulation optimizer 16 and the electric field distribution controller 15 may repeat operations (1)-(6) until the morphology of the cathode satisfies the optimization target, or a difference between the morphology of the cathode and the optimization target reaches a preset value. In some embodiments of the present disclosure, an optimized morphology of the anode, an intensity, a pattern, and a distribution of the feed current may be determined based on the real-time obtained thickness and distribution of the electroplating substance on the cathode using the electroplating simulation software, and the morphology of the anode, the intensity, the pattern, and the distribution of the feed current may be adjusted in real time. A system that works in this way can be called as an "intelligent adaptive adjustable anode."

FIG. 9 is a structural schematic diagram illustrating an electroplating anode according to some embodiments of the present disclosure. Referring to FIG. 9, the electroplating anode 1 may include the electric field distribution simulation optimizer 16, the electric field distribution controller 15, and the signal controller 13. The electric field distribution simulation optimizer 16 may be electrically connected to the electric field distribution controller 15. The electric field distribution controller 15 may be electrically connected to the signal controller 13. The electric field distribution controller 15 may be electrically connected to the driver controller 14. At an initial stage of an electroplating process, the electric field distribution simulation optimizer 16 may be configured to simulate an electric field between the electroplating anode and the cathode and a deposition of an electroplating substance on the cathode based on input initial morphological information of the cathode 2, an initial morphology of the anode, and an initial surface current distribution of the anode; determine an optimized morphology of the anode and an optimized surface current distribution of the anode using an optimization algorithm and according to an optimization target (a target morphology of the cathode) including a distribution and a thickness of the electroplating substance on a surface of the cathode; and transmit information of the optimized morphology of the anode and the optimized surface current distribution of the anode to the electric field distribution controller 15. The electric field distribution controller 15 may control an electroplating signal that is output by the signal controller 13 to each of the plurality of electrically conducting units 11. The electric field distribution controller 15 may control the driver controller 14 to transmit, to each of the plurality of drivers 141, different control signals each of which specifies an extension distance or a retraction distance of one needle rod 111 for adjusting the morphology of the anode. During the electroplating process, the electric field distribution simulation optimizer 16 may be configured to (1) simulate the electric field between the electroplating anode and the cathode and the deposition of the electroplating substance on the cathode based on the morphology of the cathode after a previous optimization operation that is closer to the optimization target, a current morphology of the anode, and a current surface current distribution of the anode; (2) determine a further optimized morphology of the anode and an optimized surface current distribution of the anode according to the optimization target using the optimization algorithm; (3) obtain the morphology of the cathode after a current optimization operation that is closer to the optimization target; and (4) transmit information of the optimized morphology of the anode and the optimized surface current distribution of the anode to the electric field distribution controller 15. The electric field distribution controller 15 may (5) control the electroplating signal that is output by the signal controller 13 to each of the plurality of electrically conducting units 11. The electric field distribution controller 15 may (6) control the drive controller 14 to transmit, to each of the plurality of drivers 141, different control signals each of which specifies an extension distance or a retraction distance of one needle rod 111 for adjusting the morphology of the anode. During the electroplating process, the electric field distribution simulation optimizer 16 and the electric field distribution controller 15 may repeat operations (1)-(6) until the morphology of the cathode satisfies the optimization target, or a difference between the morphology of the cathode and the optimization target reaches a preset value.

In some embodiments of the present disclosure, an optimized morphology of the anode, an intensity, a pattern, and a distribution of the feed current may be determined based on the initial morphology of the cathode using the electroplating simulation software, and the morphology of the anode, the intensity, the pattern, and the distribution of the feed current may be adjusted. A system that works in this way can be called as an "intelligent adaptive adjustable anode.

For example, referring to FIG. 8 and FIG. 9, the needle rod 111 and the needle head 112 of the electrically conducting unit 11 may be made of titanium alloy, or may be made of titanium alloy coated with an electrically conducting layer. The needle rod 111 may be vertically inserted into a via of the electrically insulating backplate 12, to form an array. All the needle heads 112 may be located on the same side of the electrically insulating backplate 12. On the other side of the electrically insulating backplate 12, each needle rod 111 may be connected to one driver 141. The driver 141 may drive the needle rod 111 to move linearly, thereby determining the relative distance between the needle head 112 and the electrically insulating backplate 12. All drivers 141 may be controlled by one driver controller 14. The driver controller 14 may transmit, to each of the plurality of drivers 141, different control signals each of which specifies an extension distance or a retraction distance of one needle rod 111. Each needle head 112 may feed the electroplating signal via the needle rod 111 and the feeder 132. All the feeders 132 may be connected to the signal controller 13. The signal controller 13 may determine the electroplating signal fed by the each needle head 112. The driver controller 14 and the signal controller 13 may be controlled by the electric field distribution controller 15.

Figure 10:
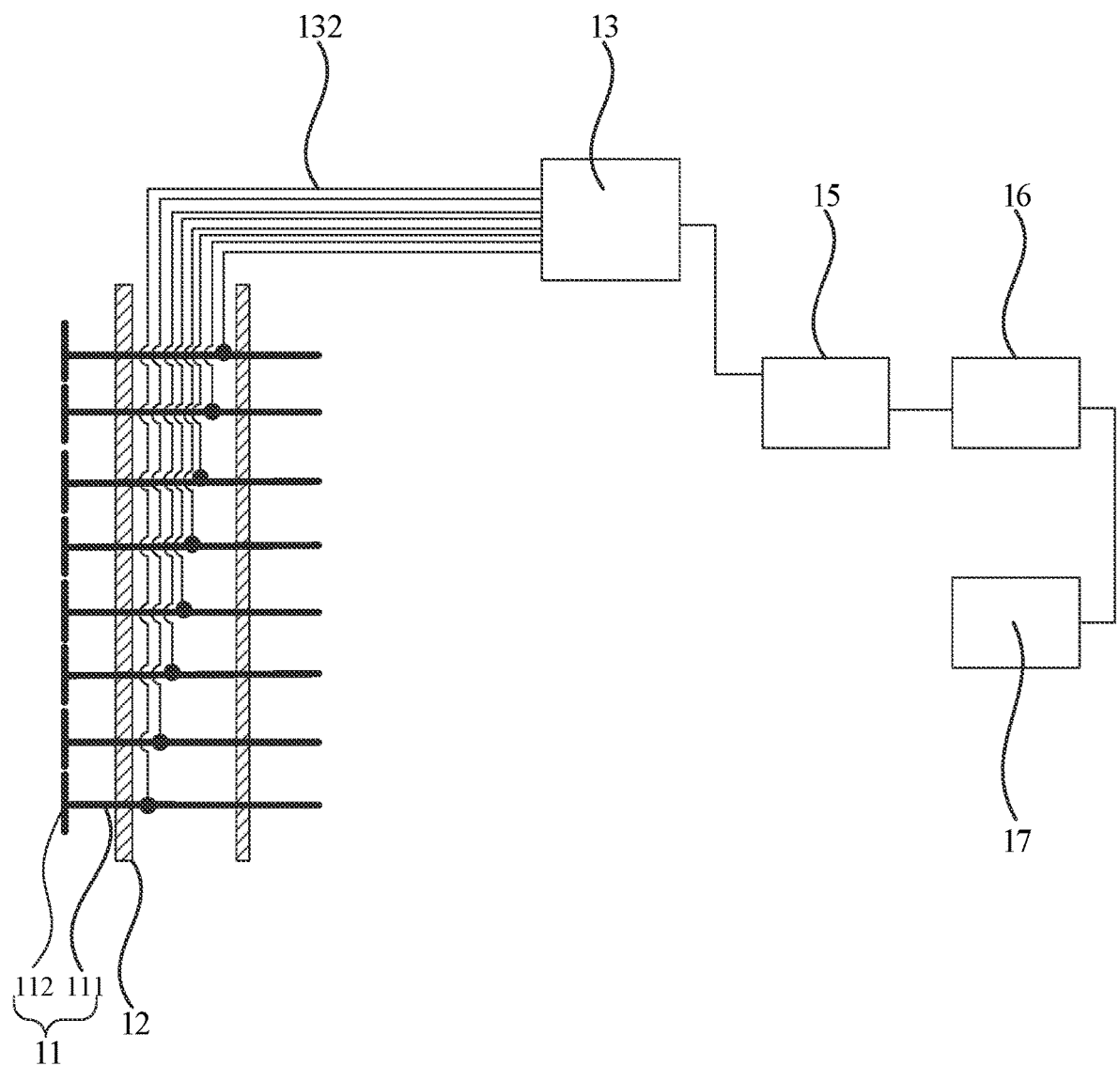
FIG. 10 is a structural schematic diagram illustrating an electroplating anode according to some embodiments of the present disclosure.

FIG. 10 is a structural schematic diagram illustrating an electroplating anode according to some embodiments of the present disclosure. Referring to FIG. 10, the distance between each needle head 112 of the plurality of needle heads 112 and the electrically insulating backplate 12 may be the same. The electroplating anode 1 may include the signal controller 13 and the plurality of feeders 132. One electrically conducting unit 11 may be electrically connected to the signal controller 13 via one feeder 132. The signal controller 13 may be configured to apply an electroplating signal to the electrically conducting unit 11. In some embodiments of the present disclosure, the distance between each needle head 112 of the plurality of needle heads 112 and the electrically insulating backplate 12 may be the same, that is, the end surfaces of all needle heads 112 may form a large plane, and the electroplating signal (e.g., a surface current density) of the each needle head 112 of the plurality of needle heads 112 may be different.

For example, referring to FIG. 10, the electroplating anode 1 may include the surface morphology detector 17, the electric field distribution simulation optimizer 16, and the electric field distribution controller 15. The input end of the electric field distribution simulation optimizer 16 may be electrically connected to the surface morphology detector 17. The output end of the electric field distribution simulation optimizer 16 may be electrically connected to the electric field distribution controller 15. The electric field distribution controller 15 may be electrically connected to the signal controller 13.

At an initial stage of an electroplating process, the electric field distribution simulation optimizer 16 may be configured to obtain initial morphological information of the cathode from the surface morphology detector 17; simulate an electric field between the electroplating anode and the cathode and a deposition of an electroplating substance on the cathode based on the initial morphology information of the cathode, a morphology of the anode, and an initial surface current distribution of the anode; determine an optimized surface current distribution of the anode using an optimization algorithm and according to an optimization target including a distribution and a thickness of the electroplating substance on a surface of the cathode; and transmit information of the optimized surface current distribution of the anode to the electric field distribution controller 15. The electric field distribution controller 15 may control an electroplating signal that is output by the signal controller 13 to each of the plurality of electrically conducting unit 11*s*. During the electroplating process, the electric field distribution simulation optimizer 16 may be configured to (1) obtain real-time morphological information of the cathode from the surface morphology detector 17; (2) simulate an electric field between the electroplating anode and the cathode and the deposition of the electroplating substance on the cathode based on the real-time morphological information of the cathode, the morphology of the anode, and a current surface current distribution of the anode; (3) determine a further optimized surface current distribution of the anode according to the optimization target using the optimizing algorithm; and (4) transmit information of the further optimized surface current distribution of the anode to the electric field distribution controller 15. The electric field distribution controller 15 may (5) control the electroplating signal that is output by the signal controller 13 to each of the plurality of electrically conducting units 11. During the electroplating process, the electric field distribution simulation optimizer 16 and the electric field distribution controller 15 may repeat operations (1)-(5) until the morphology of the cathode satisfies the optimization target, or a difference between the morphology of the cathode and the optimization target reaches a preset value.

Figure 11:
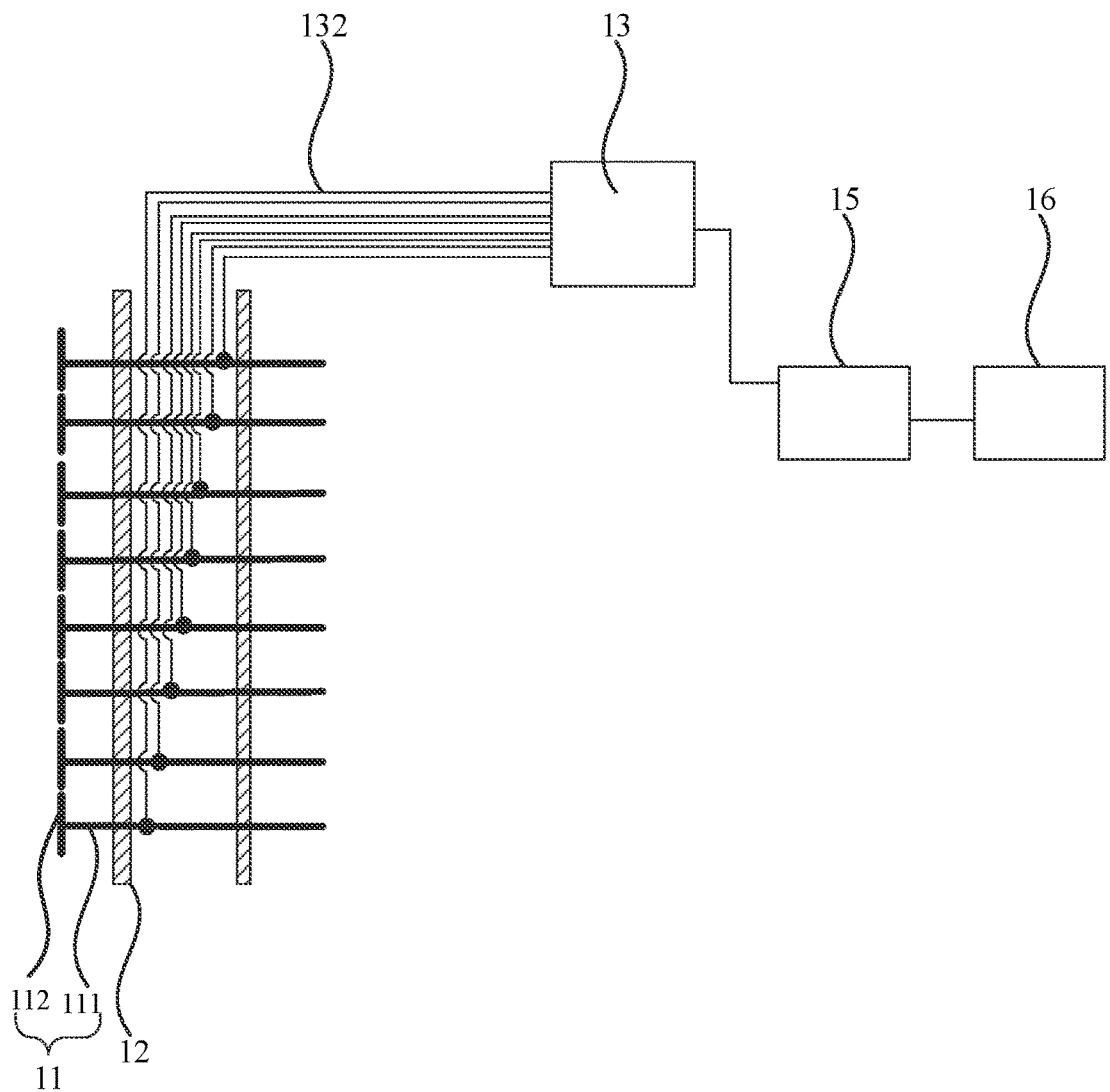
FIG. 11 is a structural schematic diagram illustrating an electroplating anode according to some embodiments of the present disclosure.

FIG. 11 is a structural schematic diagram illustrating an electroplating anode according to some embodiments of the present disclosure. The distances between each needle head 112 of the plurality of needle heads 112 and the electrically insulating backplate 12 may be the same. Referring to FIG.

11, the electroplating anode 1 may include the electric field distribution simulation optimizer 16, the electric field distribution controller 15, and the signal controller 13. The electric field distribution controller 15 may be electrically connected to the signal controller 13 and the electric field distribution simulation optimizer 16, respectively. At an initial stage of an electroplating process, the electric field distribution simulation optimizer 16 may be configured to simulate an electric field between the electroplating anode and the cathode and a deposition of an electroplating substance on the cathode based on input initial morphological information of the cathode 2, the morphology of the anode, and an initial surface current distribution of the anode; determine an optimized surface current distribution of the anode using an optimization algorithm and according to an optimization target including a distribution and a thickness of the electroplating substance on a surface of the cathode; obtain the morphology of the cathode after a current optimization operation that is closer to the optimization target; and transmit information of the optimized surface current distribution of the anode to the electric field distribution controller 15. The electric field distribution controller 15 may control an electroplating signal that is output by signal controller 13 to each of the plurality of electrically conducting unit 11. During the electroplating process, the electric field distribution simulation optimizer 16 may be configured to (1) simulate the electric field between the electroplating anode and the cathode and the deposition of the electroplating substance on the cathode based on the morphology of the cathode after a previous optimization operation that is closer to the optimization target, the morphology of the anode, and the current surface current distribution of the anode; (2) determine a further optimized surface current distribution of the anode according to the optimization target using the optimization algorithm; (3) obtain the morphology of the cathode after a current optimization operation that is closer to the optimization target; (4) transmit information of the further optimized surface current distribution of the anode to the electric field distribution controller 15. The electric field distribution controller 15 may (5) control the electroplating signal that is output by the signal controller 13 to each of the plurality of electrically conducting units 11. During the electroplating process, the electric field distribution simulation optimizer 16 and the electric field distribution controller 15 may repeat operations (1)-(5) until the morphology of the cathode satisfies the optimization target, or a difference between the morphology of the cathode and the optimization target reaches a preset value.

Figure 12:
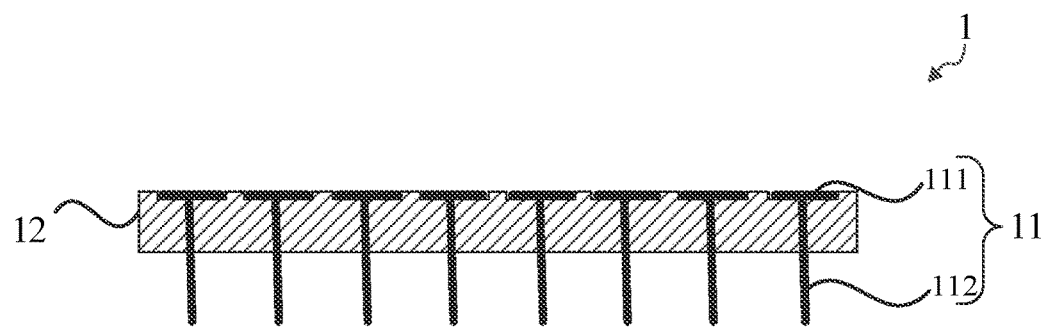
FIG. 12 is a structural schematic diagram illustrating an electroplating anode according to some embodiments of the present disclosure.

FIG. 12 is a structural schematic diagram illustrating an electroplating anode according to some embodiments of the present disclosure. Referring to FIG. 12, the electrically conducting unit 11 may be embedded in the electrically insulating backplate 12.

For example, referring to FIG. 12, a side of the electrically insulating backplate 12 may be configured with a groove. The needle heads 112 of all the electrically conducting units 11 may be fixed in the groove. The distance between the needle head 112 of each electrically conducting unit 11 of the plurality of electrically conducting units 11 and the electrically insulating backplate may be the same. One end of the needle rod 111 of the electrically conducting unit 11 may be electrically connected to the needle head 112, and the other end of the needle rod 111 of the electrically conducting unit 11 may be exposed to the outside from the other side of the electrically insulating backplate 12. It should be noted that in some embodiments of the present disclosure, the electroplating anode may further include the signal controller 13, the electric field distribution controller 15, the electric field distribution simulation optimizer 16, or the surface morphology detector 17, which is not limited herein.

Figure 13:
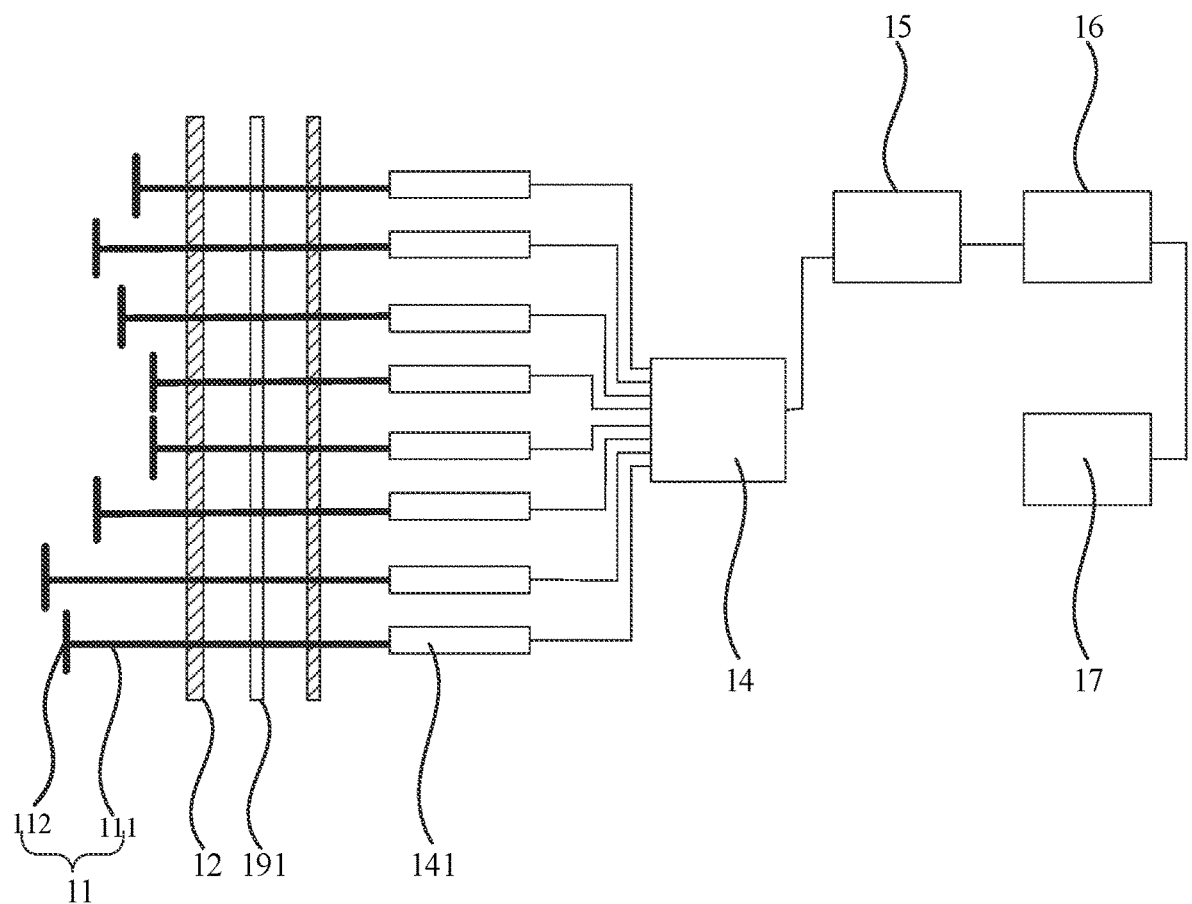
FIG. 13 is a structural schematic diagram illustrating an electroplating anode according to some embodiments of the present disclosure.

FIG. 13 is a structural schematic diagram illustrating an electroplating anode according to some embodiments of the present disclosure. Referring to FIG. 13, the electroplating anode 1 may include a plurality of drivers 141. Each of the plurality of drivers 141 may be connected to an end of a corresponding needle rod 111 that is away from the needle head 112. Each of the plurality of drivers 141 may be configured to control a distance between the needle head 112 and the electrically insulating backplate 12, and a distance between the needle head 112 and the cathode 2. In some embodiments of the present disclosure, the distance between each needle head 112 and the electrically insulating backplate 12 may be different, and the electroplating signal (e.g., a surface current density) on the end surface of the each needle head 112 may be the same.

For example, referring to FIG. 13, the electroplating anode 1 may include a feeder plate 191. All the electrically conducting units 11 may be electrically connected to the feeder plate 191. A same electroplating signal may be provided for all the needle heads 112 via the feeder plate 191, such that the electroplating signals (e.g., surface current densities) on the end surfaces of all the needle heads 112 are the same.

For example, referring to FIG. 13, the electroplating anode 1 may include the surface morphology detector 17, the electric field distribution simulation optimizer 16, and the electric field distribution controller 15. The input end of the electric field distribution simulation optimizer 16 may be electrically connected to the surface morphology detector 17. The output end of the electric field distribution simulation optimizer 16 may be electrically connected to the electric field distribution controller 15. The electric field distribution controller 15 may be electrically connected to the driver controller 14. At an initial stage of an electroplating process, the electric field distribution simulation optimizer 16 may be configured to obtain initial morphological information of the cathode from the surface morphology detector 17; determine, using an optimization algorithm and according to an optimization target including a distribution and a thickness of an electroplating substance on a surface of the cathode, an optimized morphology of the anode based on the initial morphological information of the cathode, the initial morphology of the anode, and a surface current distribution of the anode; and transmit information of the optimized morphology of the anode to the electric field distribution controller 15. The electric field distribution controller 15 may control the driver controller 14 to transmit, to the plurality of drivers 14, different control signals each of which specifies an extension distance or a retraction distance of one needle rod 111. During the electroplating process, the electric field distribution simulation optimizer 16 may be configured to (1) obtain real-time morphological information of the cathode from the surface morphology detector 17; (2) determine, using the optimization algorithm and according to the optimization target, a further optimized morphology of the anode based on the real-time morphological information of the cathode, the surface current distribution of the anode, and a current morphology of the anode; and (3) transmit information of the further optimized morphology of the anode to the electric field distribution controller 15. The electric field distribution controller 15 may (4) control the driver controller 14 to transmit, to the plurality of drivers 141, different control signals each of which specifies an extension distance or a retraction distance of one needle rod 111. During the electroplating process, the electric field distribution simulation optimizer 16 and the electric field distribution controller 15 may repeat operations (1)-(4) to adjust the morphology of the anode until the morphology of the cathode satisfies the optimization target, or a difference between the morphology of the cathode and the optimization target reaches a preset value.

Figure 14:
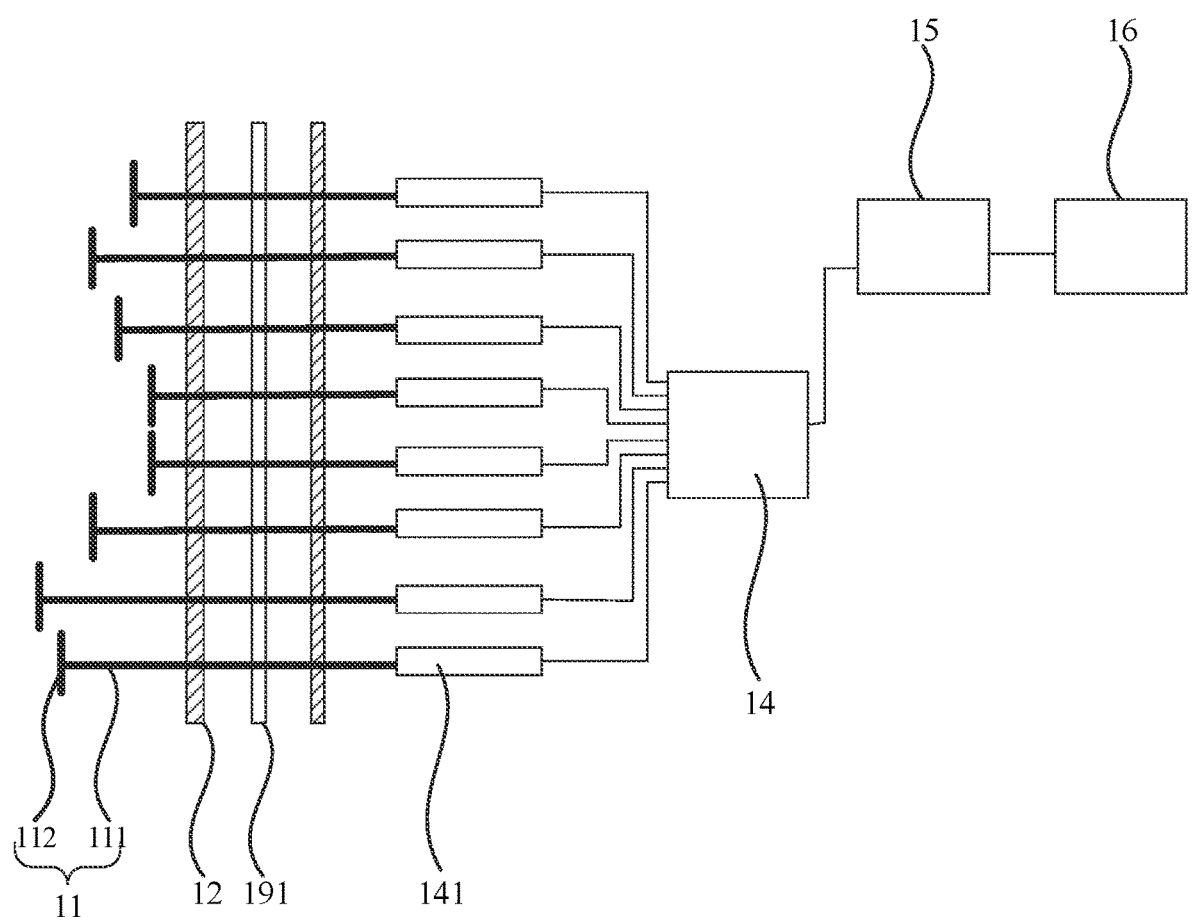
FIG. 14 is a structural schematic diagram illustrating an electroplating anode according to some embodiments of the present disclosure.

FIG. 14 is a structural schematic diagram illustrating an electroplating anode according to some embodiments of the present disclosure. The electroplating anode in FIG. 14 may be similar to the electroplating anode described in FIG. 13, and the descriptions are not repeated here. Referring to FIG. 14, the electroplating anode 1 may include the electric field distribution simulation optimizer 16 and the electric field distribution controller 15. The electric field distribution simulation optimizer 16 may be electrically connected to the electric field distribution controller 15. The electric field distribution controller 15 may be electrically connected to the driver controller 14.

The electric field distribution simulation optimizer 16 may be configured to determine an optimized morphology of the anode based on the initial morphological information of the cathode 2, the surface current distribution of the anode, and the initial morphology of the anode, using the optimization algorithm and according to the optimization target including the distribution and the thickness of the electroplating substance on the surface of the cathode; obtain the morphology of the cathode after a current optimization operation that is closer to the optimization target; and transmit information of the optimized morphology of the anode to the electric field distribution controller 15. The electric field distribution controller may control the driver controller 14 to transmit, to the plurality of drivers 141, different control signals each of which specifies an extension distance or a retraction distance of one needle rod 111. During the electroplating process, the electric field distribution simulation optimizer 16 may be configured to (1) determine, using the optimization algorithm and according to the optimization target, a further optimized morphology of the anode based on the morphology of the cathode after a previous optimization operation that is closer to the optimization target, the surface current distribution of the anode, and a current morphology of the anode; (2) obtain the morphology of the cathode after a current optimization operation that is closer to the optimization target; and (3) transmit information of the further optimized morphology of the anode to the electric field distribution controller 15. The electric field distribution controller 15 may (4) control the driver controller to transmit, to the plurality of drivers 141, different control signals each of which specifies an extension distance or a retraction distance of one needle rod 111. During the electroplating process, the electric field distribution simulation optimizer 16 and the electric field distribution controller 15 may repeat operations (1)-(4) to adjust the morphology of the anode in real-time until the morphology of the cathode satisfies the optimization target, or a difference between the morphology of the cathode and the optimization target reaches a preset value. In some embodiments of the present disclosure, the distance between each needle head 112 and the electrically insulating backplate 12 may be different, and the electroplating signal (e.g., a surface current density) on the end surface of each needle head 112 may be the same.

Figure 15:
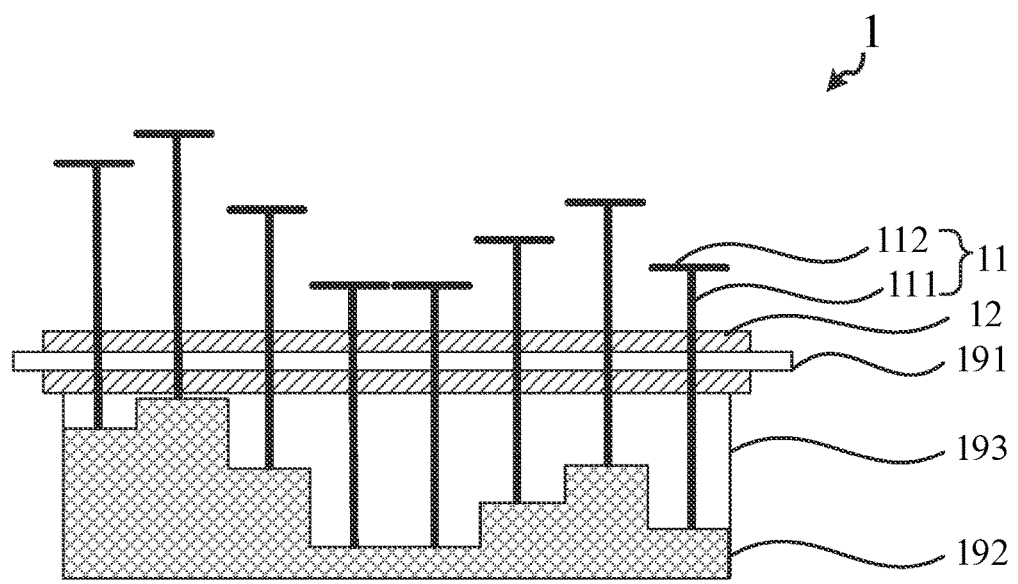
FIG. 15 is a structural schematic diagram illustrating an electroplating anode according to some embodiments of the present disclosure.

FIG. 15 is a structural schematic diagram illustrating an electroplating anode according to some embodiments of the present disclosure. Referring to FIG. 15, the electroplating anode 1 may include a mold substrate 192, a bonding layer 193, and a feeder plate 191. The bonding layer 193 may be located between the mold substrate 192 and the electrically insulating backplate 12. A morphology of the mold substrate 192 facing the electrically insulating backplate 12 may be in conformity with the morphology of the cathode 2. A protruding portion of the mold substrate 192 may correspond to a recessing portion of the cathode 2. A recessing portion of the mold substrate 192 may correspond to a protruding portion of the cathode 2. For example, the mold substrate 192 may be a polymer mold. The feeder plate 191 may be in contact with and electrically connected to the plurality of electrically conducting units 11. In some embodiments of the present disclosure, the distance between each needle head 112 and the electrically insulating backplate 12 may be different, and the electroplating signal (e.g., a surface current density) on the end surface of each needle head 112 may be the same. The bonding layer 193 may be a polymer binder or a curing agent, and configured to fix the electrically conducting unit 11. The polymer binder or the curing agent may be insoluble in an electrolyte solvent, but soluble in a non-electrolyte solvent. The mold substrate 192 and the electrically insulating backplate 12 may be insoluble in the non-electrolyte solvent. Therefore, the electrically insulating backplate 12 and the electrically conducting unit 11 may be separated using the non-electrolyte solvent, and the electrically insulating backplate 12 and the electrically conducting unit 11 may be reused.

In some embodiment, referring to FIG. 15, the electroplating anode 1 may include two electrically insulating backplates 12. The needle rod 111 may penetrate the two electrically insulating backplates 12 via an end of the needle rod 111 away from the needle head. The feeder plate 191 may be located between the two electrically insulating backplates 12. In some embodiments of the present disclosure, on the one hand, the feeder plate 191 may be located between the two electrically insulating backplates 12, and the two electrically insulating backplates 12 can be used to protect the feeder plate 191. On the other hand, the feeder plate 191 may be located between the two electrically insulating backplates 12, the feeder plate 191 can utilize the space between the two electrically insulating backplates 12, and does not occupy the space other than the two electrically insulating backplates 12, the space utilization rate may be increased, and the integration of the components in the electroplating anode 1 may be improved.

Since the electroplating anode 1 described in FIG. 15 includes the mold substrate 192, the bonding layer 193, and the feeder plate 191, after the morphology of the electroplating anode 1 is formed, the morphology of the electroplating anode 1 cannot be changed. The feeder plate 191 may provide the same electroplating signal to all the needle heads 112, such that the electroplating signals (e.g., surface current densities) on the end surfaces of all the needle heads 112 are the same at a same time point.

In some embodiments, the electroplating anode described in FIG. 15 may include the electric field distribution simulation optimizer, the electric field distribution controller, and the signal controller. The electric field distribution controller may be electrically connected to the signal controller and the electric field distribution simulation optimizer, respectively. The signal controller may be electrically connected to the plurality of electrically conducting units. The signal controller may be configured to apply an electroplating signal to the plurality of electrically conducting units.

Before an electroplating process starts, the electric field distribution simulation optimizer may be configured to simulate the electric field between the electroplating anode and the cathode, and a deposition of an electroplating substance on the cathode based on input initial morphological information of the cathode, an initial morphology of the anode, and an initial surface current distribution of the anode; determine, using an optimization algorithm and according to an optimization target including a distribution and a thickness of the electroplating substance on a surface of the cathode, a morphology of the mold substrate (a morphology of the electroplating anode) and an optimized surface current distribution of the anode; and transmit information of the optimized surface current distribution of the anode to the electric field distribution controller. The electric field distribution controller may control the electroplating signal that is output by the signal controller to the plurality of electrically conducting units.

In some embodiment, the electroplating anode described in FIG. 15 may include the electric field distribution simulation optimizer, the electric field distribution controller, and the signal controller.

The electric field distribution controller may be electrically connected to the signal controller and the electric field distribution simulation optimizer, respectively. The signal controller may be electrically connected to the plurality of electrically conducting units. The signal controller may be configured to apply an electroplating signal to the electrically conducting unit.

Before an electroplating process starts, the electric field distribution simulation optimizer may be configured to simulate the electric field between the electroplating anode and the cathode and a deposition of an electroplating substance on the cathode based on input initial morphological information of the cathode, an initial morphology of the anode, and an initial surface current distribution of the anode; determine, using an optimization algorithm and according to an optimization target including a distribution and a thickness of the electroplating substance on a surface of the cathode, a morphology of the mold substrate (a morphology of the electroplating anode) and an optimized surface current distribution of the anode; obtain the morphology of the cathode after a current optimization operation that is closer to the optimization target; and transmit information of the optimized surface current distribution of the anode to the electric field distribution controller. The electric field distribution controller may control an electroplating signal that is output by the signal controller to the plurality of electrically conducting units. During the electroplating process, the electric field distribution simulation optimizer may be configured to (1) simulate the electric field between the electroplating anode and the cathode and the deposition of the electroplating substance on the cathode based on the morphology of the cathode after a previous optimization operation that is closer to the optimization target, the morphology of the anode, and the current surface current distribution of the anode; (2) determine a further optimized surface current distribution of the anode according to the optimization target using the optimization algorithm; (3) obtain the morphology of the cathode after a current optimization operation that is closer to the optimization target; and (4) transmit information of the further optimized surface current distribution of the anode to the electric field distribution controller. The electric field distribution controller may (5) control the electroplating signal that is output by the signal controller to the plurality of electrically conducting units. During the electroplating process, the electric field distribution simulation optimizer and the electric field distribution controller may repeat operations (1)-(5) until the morphology of the cathode satisfies the optimization target, or a difference between the morphology of the cathode and the optimization target reaches a preset value.

Figure 16:
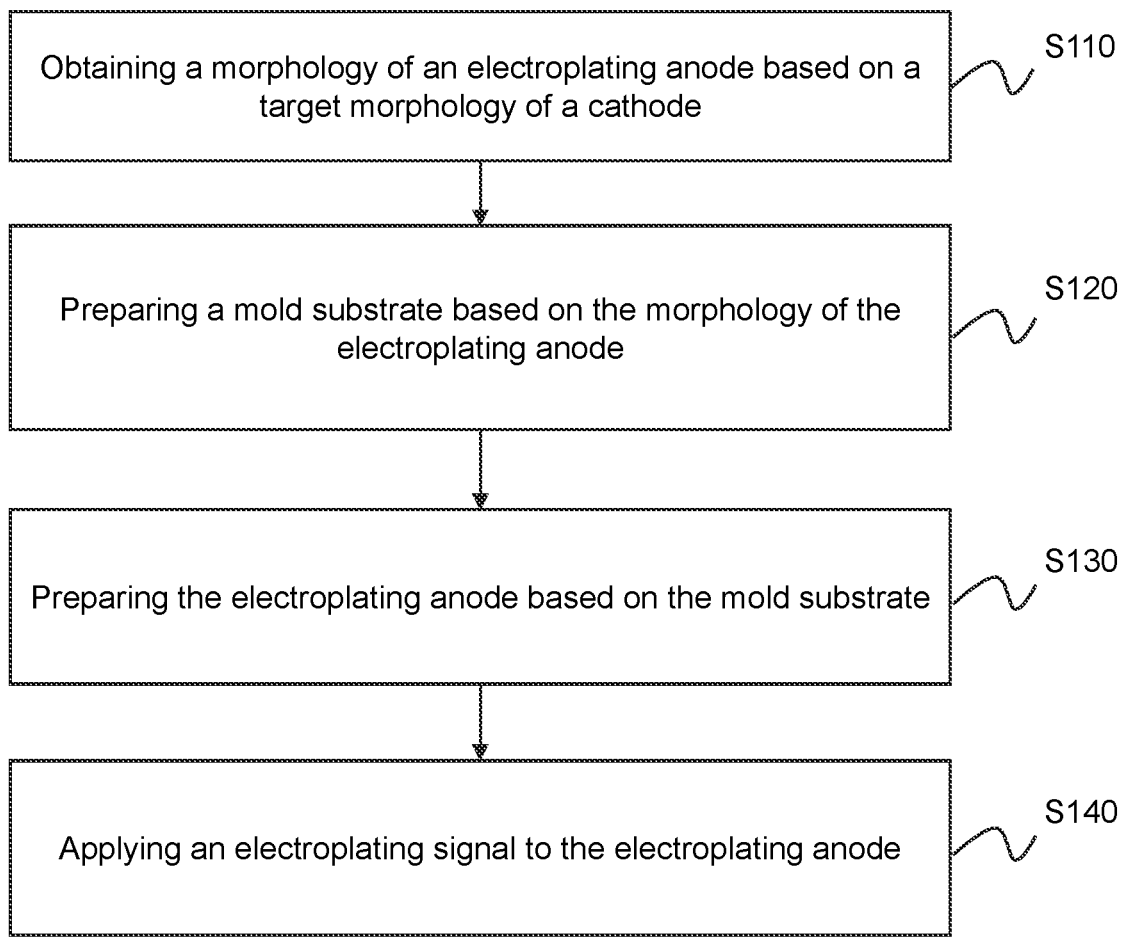
FIG. 16 is a flowchart diagram illustrating an electroplating method using an electroplating anode according to some embodiments of the present disclosure.

FIG. 16 is a flowchart diagram illustrating an electroplating method using an electroplating anode according to some embodiments of the present disclosure. Based on the electroplating anode shown in FIG. 1A, referring to FIG. 16 and FIG. 1A, the electroplating anode 1 and the cathode 2 to be electroplated may form the electric field to deposit the electroplating layer on the surface of the cathode 2. The morphology of the cathode 2 may be uneven. The electroplating anode 1 may include an electrically conducting plate or an electrically conducting mesh. The morphology of the electrically conducting plate may be in conformity with or approximately in conformity with the morphology of the cathode 2. The protruding portion of the electrically conducting plate may correspond to the recessing portion of the cathode 2. The recessing portion of the electrically conducting plate may correspond to the protruding portion of the cathode 2. The electroplating method may include operation S110 to operation S140.

In operation S110, the morphology of the anode 1 may be obtained based on a target morphology of the cathode 2.

For example, the electric field distribution simulation optimizer may determine an optimized morphology of the electroplating anode based on initial morphological information of the cathode, an initial morphology of the anode, and an initial surface current distribution of the anode, using an optimization algorithm and according to an optimization target (the target morphology) including a distribution and a thickness of the electroplating substance on a surface of the cathode.

In operation S120, a mold substrate 192 may be prepared based on the morphology of the anode 1.

A morphology of a side of the mold substrate 192 may be in conformity with or approximately in conformity with the morphology of the cathode 2. A protruding portion on the side of the mold substrate 1920 may correspond to the recessing portion of the cathode 2. A recessing portion on the side of the mold substrate 192 may correspond to the protruding portion of the cathode 2.

In operation S130, the electroplating anode 1 may be prepared based on the mold substrate 192.

In operation S140, an electroplating signal may be applied to the electroplating anode 1.

Some embodiments of the present disclosure may provide the electroplating method using the electroplating anode, which is used to form the electroplating anode shown in FIG. 1A, and the electroplating of the cathode may be achieved using the electroplating anode.

It should be noted that, in operation S140, the electroplating signal applied to the electroplating anode 1 may be constant or variable, the following descriptions may be provided with reference to the electroplating anodes shown in FIGS. 1B and 1C.

In some embodiments, referring to FIG. 1B, the electroplating anode 1 may include the surface morphology detector 17, the electric field distribution simulation optimizer 16, the electric field distribution controller 15, and the signal controller 13. The input end of the electric field distribution simulation optimizer 16 may be electrically connected to the surface morphology detector 17. The output end of the electric field distribution simulation optimizer 16 may be electrically connected to the electric field distribution controller 15. The electric field distribution controller 15 may be electrically connected to the signal controller 13. The signal controller 13 may be electrically connected to the electrically conducting plate. The signal controller 13 may be configured to apply an electroplating signal to the electrically conducting plate.

The obtaining the morphology of the anode based on the target morphology of the cathode (corresponding to operation S110) and the obtaining the electroplating signal (corresponding to operation S140) may include: before an electroplating process starts, the electric field distribution simulation optimizer 16 may obtain initial morphological information of the cathode from the surface morphology detector 17; simulate an electric field between the electroplating anode 1 and the cathode 2 and a deposition of an electroplating substance on the cathode based on the initial morphological information of the cathode, an initial morphology of the anode, and an initial surface current distribution of the anode; determine, using an optimization algorithm and according to an optimization target including a distribution and a thickness of the electroplating substance on a surface of the cathode 2, a morphology of the electroplating anode 1 (i.e., a morphology of the electrically conducting plate shown in FIG. 1A, the morphology of the electrically conducting plate cannot be changed once the morphology of the electrically conducting plate is formed) and an optimized surface current distribution of the anode; and transmit information of the optimized surface current distribution of the anode to the electric field distribution controller 15. The electric field distribution controller 15 may control the electroplating signal that is output by the signal controller 13 to the electrically conducting plate. During the electroplating process, the electric field distribution simulation optimizer 16 may be configured to (1) obtain real-time morphological information of the cathode from the surface morphology detector 17; (2) simulate the electric field between the electroplating anode 1 and the cathode 2 and the deposition of the electroplating substance on the cathode 2 based on the real-time morphological information of the cathode, the morphology of the electrically conducting plate, and a current surface current distribution of the anode; (3) determine a further optimized surface current distribution of the anode according to the optimization target using the optimizing algorithm; and transmit information of the further optimized surface current distribution of the anode to the electric field distribution controller 15. The electric field distribution controller 15 may (4) control the electroplating signal that is output by the signal controller 13 to the electrically conducting plate. During the electroplating process, the electric field distribution simulation optimizer 16 and the electric field distribution controller 15 may repeat operations (1)-(4) until the morphology of the cathode 2 satisfies the optimization target, or a difference between the morphology of the cathode and the optimization target reaches a preset value. In some embodiments, during the electroplating process, the electroplating signal may be optimized in real time.

In some embodiments, referring to FIG. 1C, the electroplating anode 1 may include the electric field distribution simulation optimizer 16, the electric field distribution controller 15, and the signal controller 13.

The electric field distribution controller 15 may be electrically connected to the signal controller 13 and the electric field distribution simulation optimizer 16, respectively. The signal controller 13 may be electrically connected to the electrically conducting plate. The signal controller 13 may be configured to apply an electroplating signal to the electrically conducting plate.

The obtaining the morphology of the anode based on the target morphology of the cathode (corresponding to operation S110) and the obtaining the electroplating signal (corresponding to operation S140) may include: before an electroplating process starts, the electric field distribution simulation optimizer 16 may simulate an electric field between the electroplating anode 1 and the cathode 2 and a deposition of an electroplating substance on the cathode 2 based on input target morphological information of the cathode, an initial morphology of the anode, and an initial surface current distribution of the anode; determine, using an optimization algorithm and according to an optimization target including a distribution and a thickness of the electroplating substance on a surface of the cathode 2, a morphology of the electroplating anode 1 (i.e., a morphology of the electrically conducting plate shown in FIG. 1A, and the morphology of the electrically conducting plate cannot be changed once the morphology of the electrically conducting plate is formed in this embodiment) and an optimized surface current distribution of the anode; and transmit information of the optimized surface current distribution of the anode to the electric field distribution controller 15. The electric field distribution controller 15 may control the electroplating signal that is output by the signal controller 13 to the electrically conducting plate. In some embodiments, the optimization may be performed only once before the electroplating process starts to obtain the optimized electroplating signal, and during the electroplating process, the optimized electroplating signal may be unchanged.

In some embodiments, referring to FIG. 1C, the electroplating anode 1 may include the electric field distribution simulation optimizer 16, the electric field distribution controller 15, and the signal controller 13.

The electric field distribution controller 15 may be electrically connected to the signal controller 13 and the electric field distribution simulation optimizer 16, respectively. The signal controller 13 may be electrically connected to the electrically conducting plate. The signal controller 13 may be configured to apply an electroplating signal to the electrically conducting plate.

The obtaining the morphology of the anode based on the target morphology of the cathode (corresponding to operation S110) and the obtaining the electroplating signal (corresponding to operation S140) may include: before an electroplating process starts, the electric field distribution simulation optimizer 16 may simulate an electric field between the electroplating anode 1 and the cathode 2 and a deposition of an electroplating substance on the cathode 2 based on input initial morphological information of the cathode, an initial morphology of the anode, and an initial surface current distribution of the anode; determine, using an optimization algorithm and according to an optimization target including a distribution and a thickness of the electroplating substance on a surface of the cathode 2, a morphology of the electroplating anode 1 (i.e., a morphology of the electrically conducting plate shown in FIG. 1A, and the morphology of the electrically conducting plate cannot be changed once the morphology of the electrically conducting plate is formed in this embodiment) and an optimized surface current distribution of the anode; obtain the morphology of the cathode after a current optimization operation that is closer to the optimization target; and transmit information of the optimized surface current distribution of the anode to the electric field distribution controller 15. The electric field distribution controller 15 may control the electroplating signal that is output by the signal controller 13 to the electrically conducting plate.

During the electroplating process, the electric field distribution simulation optimizer 16 may (1) simulate the electric field between the electroplating anode 1 and the cathode 2 and the deposition of the electroplating substance on the cathode 2 based on the morphology of the cathode after a previous optimization operation that is closer to the optimization target, the morphology of the electroplating anode 1 (i.e., the morphology of the electrically conducting plate), and a current surface current distribution of the anode; determine a further optimized surface current distribution of the anode according to the optimization target using the optimization algorithm; (2) obtain the morphology of the cathode after a current optimization operation that is closer to the optimization target; and (3) transmit information of the further optimized surface current distribution of the anode to the electric field distribution controller 15. The electric field distribution controller 15 may (4) control the electroplating signal that is output by the signal controller 13 to the electrically conducting plate. During the electroplating process, the electric field distribution simulation optimizer 16 and the electric field distribution controller 15 may repeat operations (1)-(4) until the morphology of the cathode satisfies the optimization target, or a difference between the morphology of the cathode and the optimization target reaches a preset value. In some embodiments, during the electroplating process, the electroplating signal may be optimized in real time.

Figure 17:
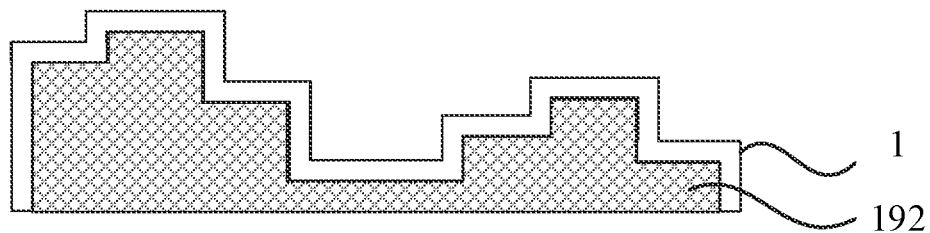
FIG. 17 is a schematic diagram illustrating a fabrication of an electroplating anode according to some embodiments of the present disclosure.

FIG. 17 is a schematic diagram illustrating a fabrication of an electroplating anode according to some embodiments of the present disclosure. Referring to FIG. 17, the preparing the electroplating anode 1 based on the mold substrate 192 (i.e., operation S130) may include forming the electroplating anode 1 by coating or depositing an electrically conducting layer on the mold substrate 192.

For example, an optimized morphology of the anode may be obtained by the electric field distribution simulation optimizer 16. The mold substrate 192 may be prepared based on the optimized morphology of the anode. For example, the mold substrate 192 may be a polymer mold. The electroplating anode may be formed by coating or depositing an insoluble electrically conducting layer or a soluble electrically conducting layer on the polymer mold.

Figure 18:
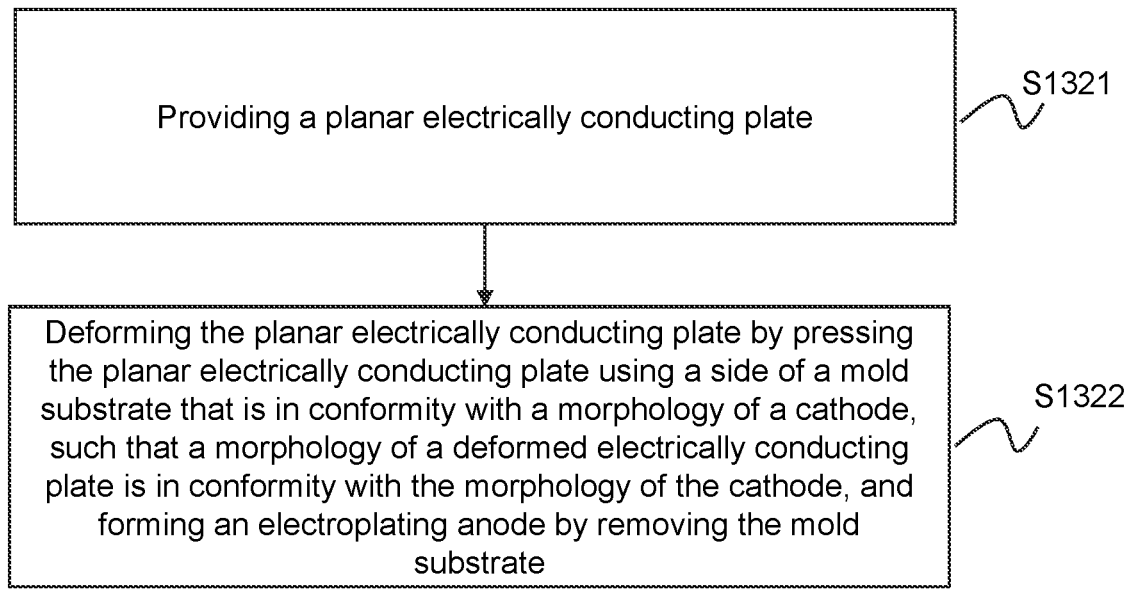
FIG. 18 is a flowchart diagram illustrating detailed operations in operation S130 of FIG. 16.
Figure 19:
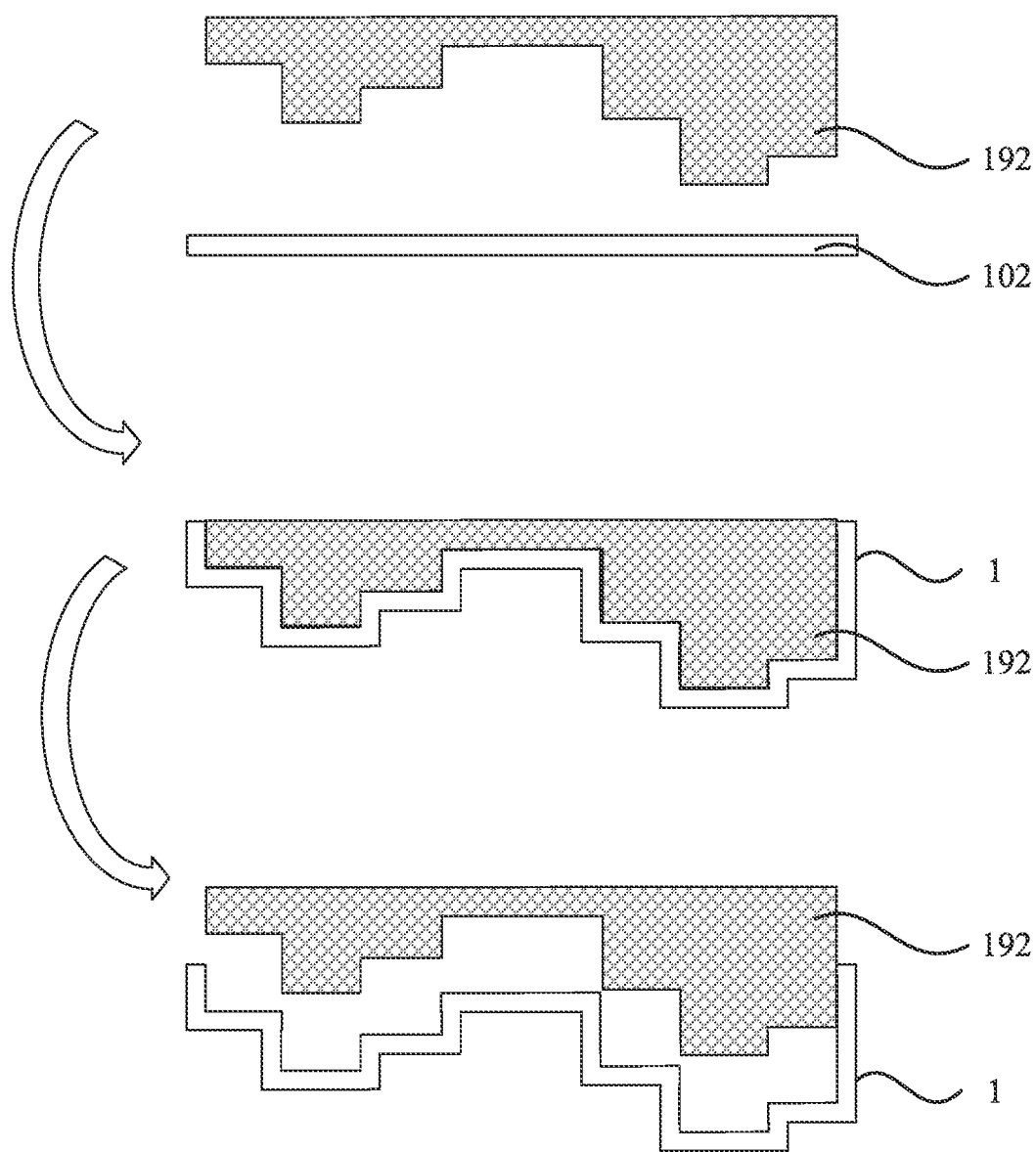
FIG. 19 is a schematic diagram illustrating a fabrication of an electroplating anode according to some embodiments of the present disclosure.

FIG. 18 is a flowchart diagram illustrating detailed operations in operation S130 of FIG. 16. FIG. 19 is a schematic diagram illustrating a fabrication of an electroplating anode according to some embodiments of the present disclosure. Referring to FIG. 18 and FIG. 19, the preparing the electroplating anode 1 based on the mold substrate 192 (i.e., operation S130) may include operations S1321 to S1322.

In operation S1321, a planar electrically conducting plate 102 may be provided.

The planar electrically conducting plate 102 may be a plate or a mesh.

In operation S1322, the planar electrically conducting plate 102 may be deformed by pressing the planar electrically conducting plate 102 using the side of the mold substrate 192 that is in conformity with the morphology of the cathode 2, such that a morphology of a deformed electrically conducting plate 102 is in conformity with the morphology of the cathode 2, and the electroplating anode 2 may be formed by removing the mold substrate 192. For example, the mold substrate 192 may be a rigid mold.

Figure 20:
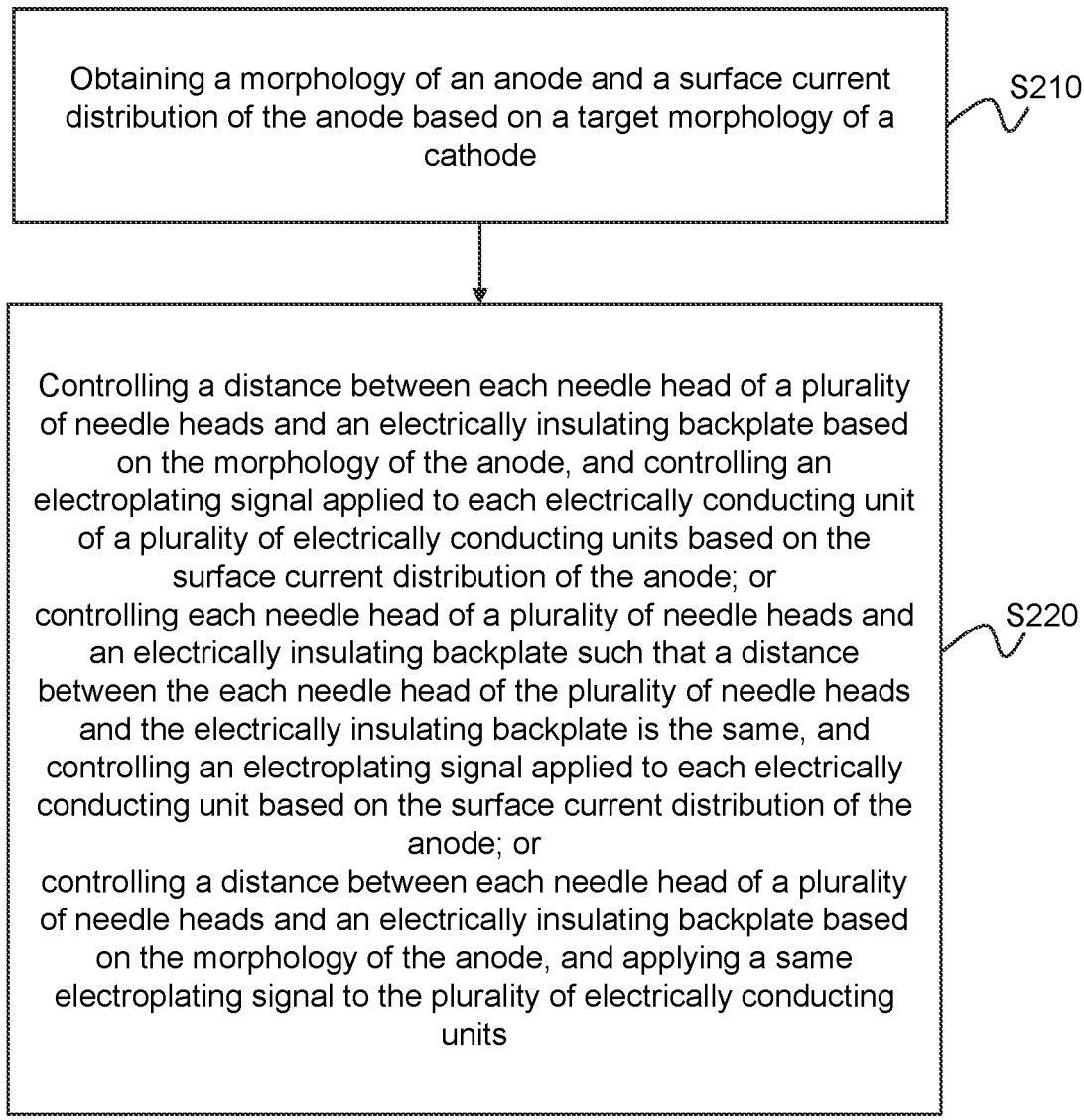
FIG. 20 is a flowchart diagram illustrating an electroplating method using an electroplating anode according to some embodiments of the present disclosure.

FIG. 20 is a flowchart diagram illustrating an electroplating method using an electroplating anode according to some embodiments of the present disclosure. Based on the electroplating anode shown in FIG. 2-FIG. 15, referring to FIG. 20, FIG. 2-FIG. 15, the electroplating anode 1 and the cathode 2 to be electroplated may form an electric field to deposit an electroplating layer on the surface of cathode 2. The morphology of cathode 2 may be uneven. The electroplating anode 1 may include the electrically insulating backplate 12 and the plurality of electrically conducting units 11. Each of the electrically conducting units 11 may include the needle rod 111 and the needle head 112 configured at one end of the needle rod 111. The end of needle rod 111 with the needle head 112 may be configured as the electroplating end of the electrically conducting unit 11. The electrically conducting unit 11 may be supported by the electrically insulating backplate 12 via the needle rod 111. The plurality of electrically conducting units 11 may be arranged in an array. Any two of the plurality of electrically conducting units 11 may be electrically insulated from each other. The electroplating method may include operations S210 to S220.

In operation S210, a morphology of the anode and a surface current distribution of the anode may be obtained based on a target morphology of the cathode 2.

In operation S220, a distance between each needle head 112 of the plurality of needle heads 112 and the electrically insulating backplate 12 may be controlled based on the morphology of the anode, and an electroplating signal applied to the each electrically conducting unit 11 of the plurality of electrically conducting units 11 may be controlled based on the surface current distribution of the anode. Alternatively, each needle head 112 of the plurality of needle heads 112 and the electrically insulating backplate 12 may be controlled such that the distance between the each needle head 112 of the plurality of needle heads 112 and the electrically insulating backplate 12 is the same, and an electroplating signal applied to the each electrically conducting unit 11 may be controlled based on the surface current distribution of the anode. Alternatively, a distance between each needle head 112 of the plurality of needle heads 112 and the electrically insulating backplate 12 may be controlled based on the morphology of the anode, and a same electroplating signal may be applied to the plurality of electrically conducting units 11.

The morphology of the anode and the surface current distribution of the anode may be obtained from the electric field distribution simulation optimizer 16.

For example, referring to FIG. 8 and FIG. 9, the distance between each needle head 112 and the electrically insulating backplate 12 may be controlled based on the morphology of the anode, and the electroplating signal applied to each electrically conducting unit 11 may be controlled based on the surface current distribution of the anode.

As another example, referring to FIG. 10 and FIG. 11, each needle head 112 and the electrically insulating backplate 12 may be controlled such that the distance between the each needle head 112 and the electrically insulating backplate 12 is the same, and the electroplating signal applied to each electrically conducting unit 11 may be controlled based on the surface current distribution of the anode.

As another example, referring to FIG. 13, FIG. 14, and FIG. 15, the distance between each needle head 112 and the electrically insulating backplate 12 may be controlled based on the morphology of the anode, and a same electroplating signal may be applied to the plurality of electrically conducting units 11 based on the surface current distribution of the anode.

Some embodiments of the present disclosure provide the electroplating method using the electroplating anode, which is used to form the electroplating anodes shown in FIGS. 2-15, and the electroplating of the cathode may be achieved using the electroplating anodes.

Figure 21:
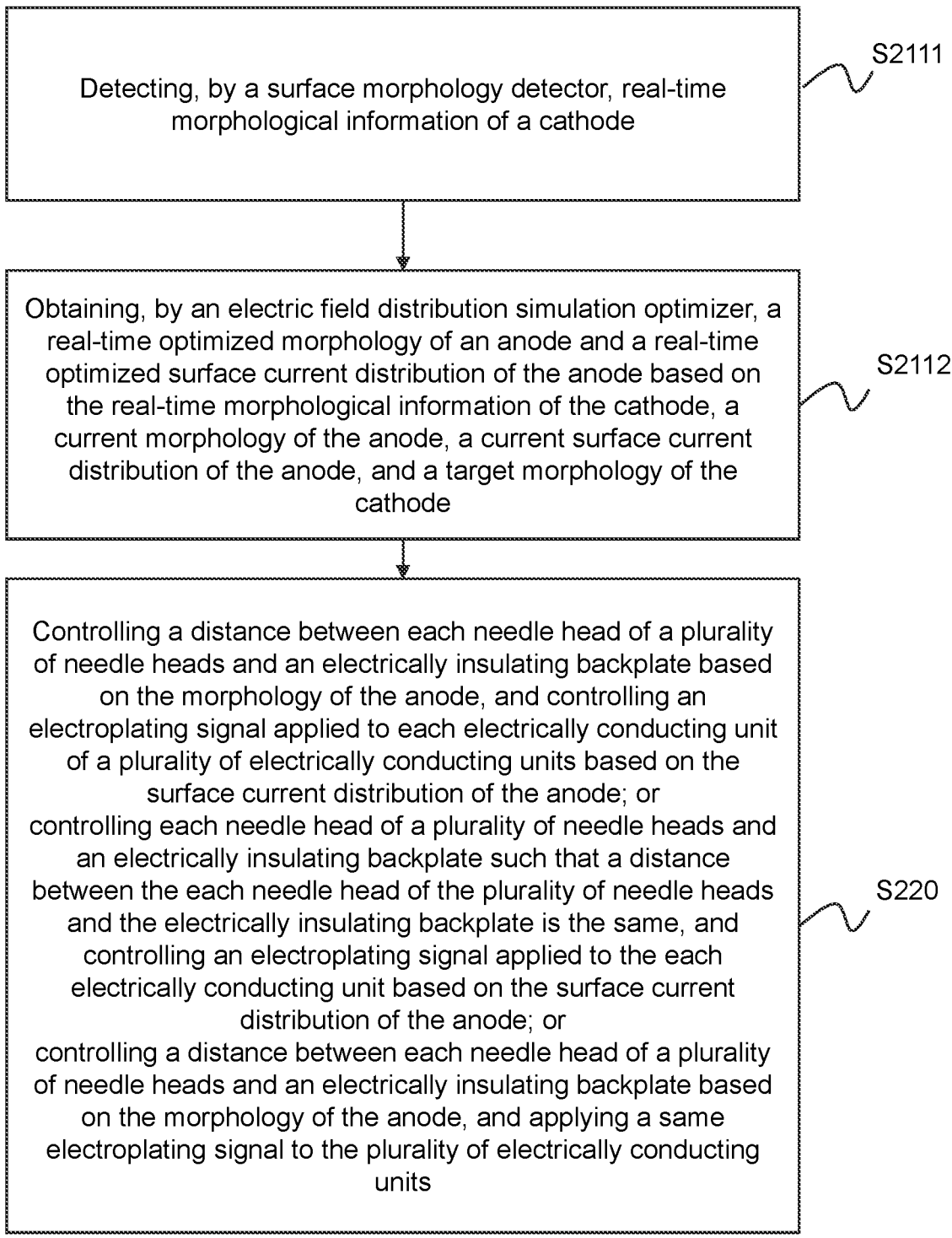
FIG. 21 is a flowchart diagram illustrating an electroplating method using an electroplating anode according to some embodiments of the present disclosure.

FIG. 21 is a flowchart diagram illustrating an electroplating method using an electroplating anode according to some embodiments of the present disclosure. Referring to FIG. 8, FIG. 10, FIG. 13, FIG. 20, and FIG. 21, the electroplating anode 1 may include the surface morphology detector 17 and the electric field distribution simulation optimizer 16. The obtaining the morphology of the anode and the surface current distribution of the anode based on the target morphology of the cathode 2 (i.e., an optimization target including a distribution and a thickness of the electroplating substance on a surface of the cathode) (i.e., operation S210) may include operations S2111-S2112.

In operation S2111, real-time morphological information of the cathode 2 may be detected by the surface morphology detector 17.

In operation S2112, a real-time optimized morphology of the anode and a real-time optimized surface current distribution of the anode may be obtained by the electric field distribution simulation optimizer 16 based on the real-time morphological information of the cathode, a current morphology of the anode, a current surface current distribution of the anode, and the target morphology of the cathode 2.

FIG. 22 is a flowchart diagram illustrating an electroplating method using an electroplating anode according to some embodiments of the present disclosure. Referring to FIG. 9, FIG. 11, FIG. 14, FIG. 20 and FIG. 22, the electroplating anode 1 may include the electric field distribution simulation optimizer 16. The obtaining the morphology of the anode and the surface current distribution of the anode based on the target morphology of the cathode 2 (i.e., an optimization target including a distribution and a thickness of the electroplating substance on a surface of the cathode) (i.e., operation S210) may include operation S2121.

In operation S2121, an optimized morphology of the anode and an optimized surface current distribution of the anode may be obtained by the electric field distribution simulation optimizer 16 based on the morphology of the cathode after a previous optimization operation that is closer to the optimization target or an initial morphology of the cathode, a current morphology of the anode, a current surface current distribution of the anode, and the target morphology of the cathode 2.

In some embodiments, referring to FIG. 8, FIG. 9, FIG. 13, FIG. 14 and FIG. 20, the electroplating anode 1 may include the plurality of drivers 141. Each driver 141 may be connected to the end of the corresponding needle rod 111 away from the needle head 112. Each driver 141 may be configured to control the distance between the needle head 112 and the electrically insulating backplate 12.

In operation S220, the controlling a distance between the each needle head 112 of the plurality of needle heads 112 and the electrically insulating backplate 12 based on the morphology of the anode may include: controlling the distance between each needle head 112 and the electrically insulating backplate 12 by controlling, based on the morphology of the anode, each driver 141 to drive the electrically conducting unit 11 connected to the driver 141 to move.

In some embodiment, referring to FIG. 5, FIG. 7, and FIG. 20, the electroplating anode 1 may further include an electrically insulating thread 114 and an electrically insulating nut 113. The insulating nut 113 may be fixed on the electrically insulating backplate 12. The electrically insulating thread 114 may be disposed on the needle rod 111. The electrically insulating thread 114 may be engaged with the electrically insulating nut 113.

In operation S220, the controlling the distance between the each needle head 112 and the insulating back plate 12 based on the morphology of the anode may include: controlling the distance between the each needle head 112 and the electrically insulating backplate 12 by rotating, based on the morphology of the anode, the electrically insulating thread 114 in the electrically insulating nut 113.

Figure 23:
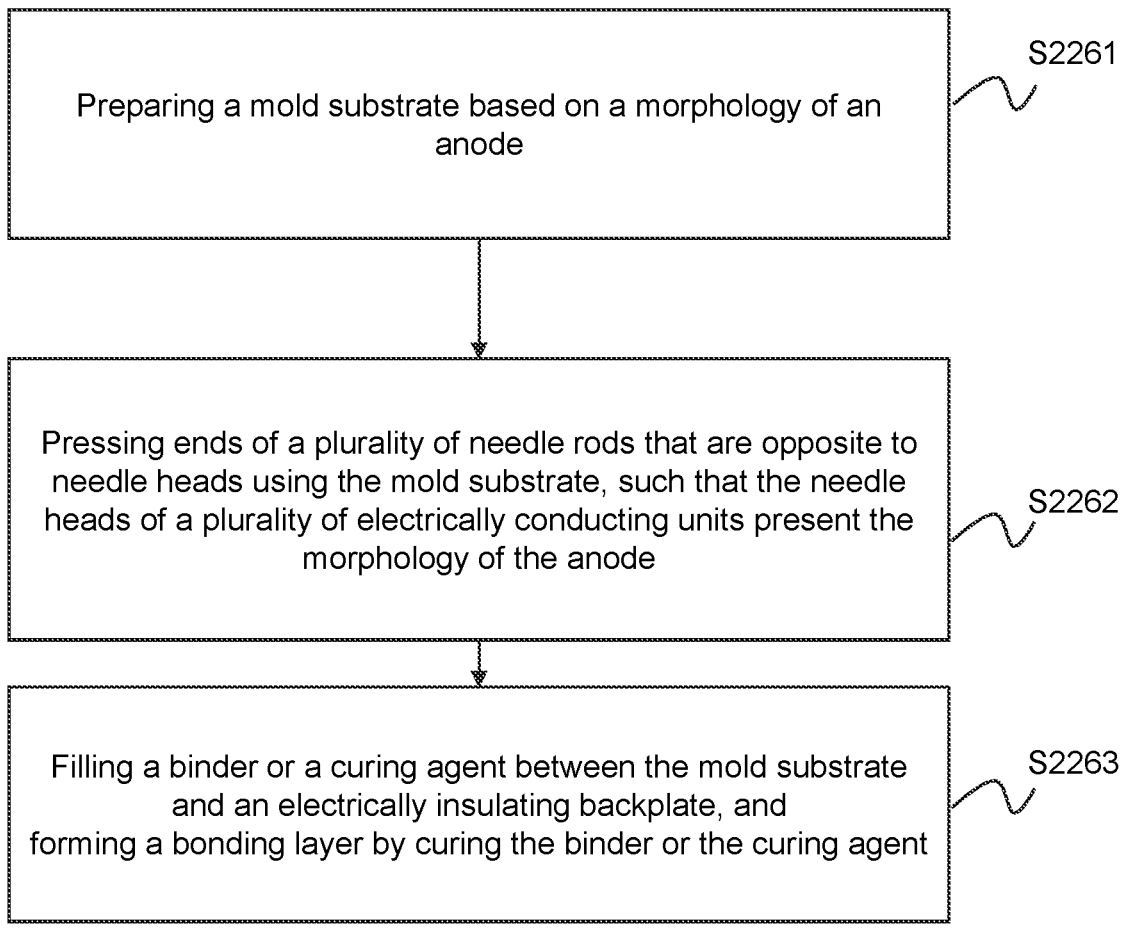
FIG. 23 is a flowchart diagram illustrating a fabrication of an electroplating anode according to some embodiments of the present disclosure.
Figure 24:
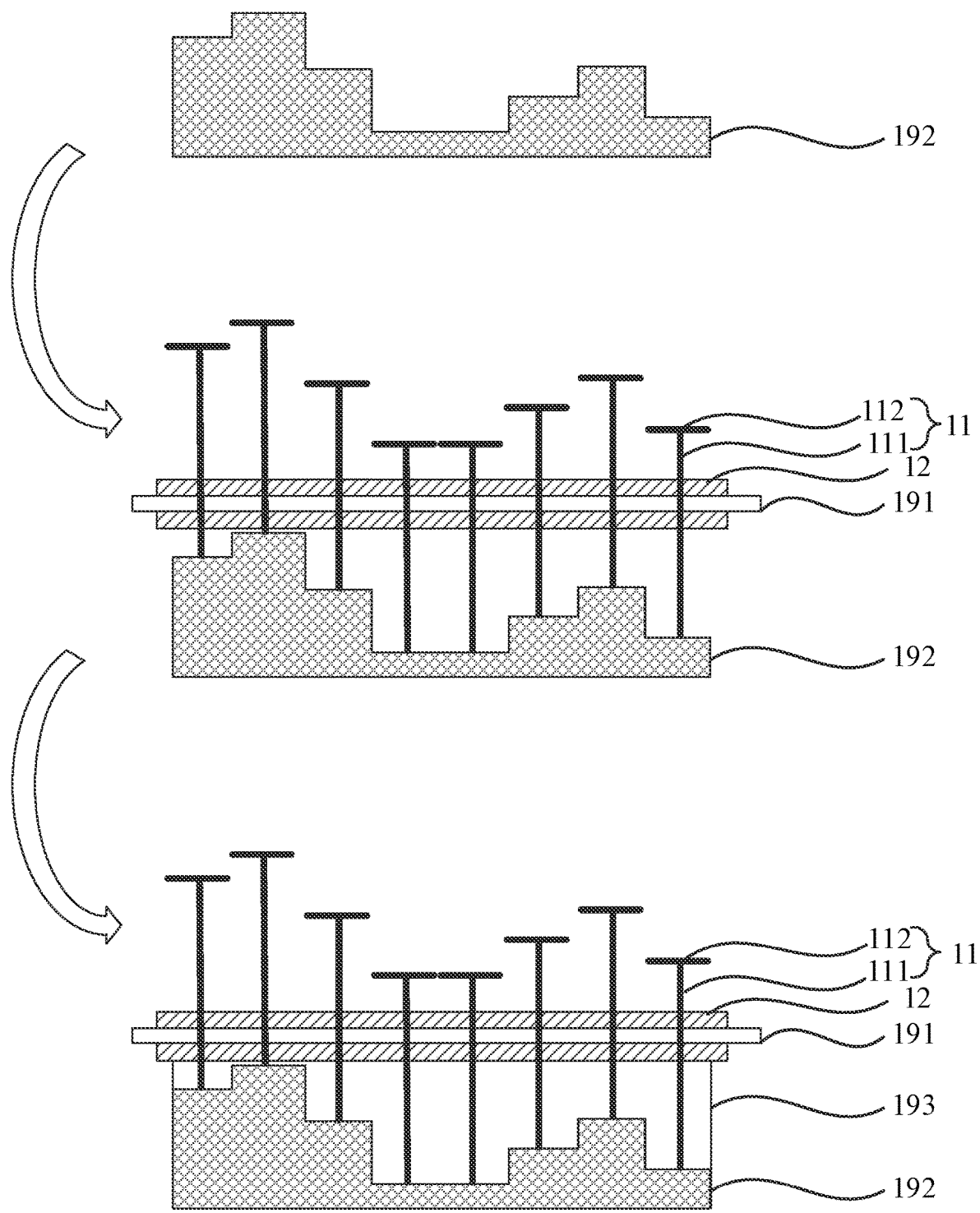
FIG. 24 is a schematic diagram illustrating a fabrication of an electroplating anode according to some embodiments of the present disclosure.

FIG. 23 is a flowchart diagram illustrating a fabrication of an electroplating anode according to some embodiments of the present disclosure. FIG. 24 is a schematic diagram illustrating a fabrication of an electroplating anode (e.g., the electroplating anode shown in FIG. 15) according to some embodiments of the present disclosure.

Referring to FIG. 23, in operation S220, the controlling a distance between the each needle head 112 and the electrically insulating backplate 12 based on the morphology of the anode may include operations S2261-S2263.

In operation S2261, a mold substrate 192 may be prepared based on the morphology of the anode.

In operation S2262, ends of the plurality of needle rods 111 that are opposite to the needle heads 112 may be pressed using the mold substrate 192, such that the plurality of needle heads 112 of the plurality of electrically conducting units 11 present the morphology of the anode.

In operation S2263, a binder or a curing agent may be filled between the mold substrate 192 and the electrically insulating backplate 12, and a bonding layer 193 may be formed by curing the binder or the curing agent.

The electroplating anode may be manufactured according to operations S2261-S2263, and the descriptions of the electroplating process using the electroplating anode may be found in FIG. 15 and descriptions thereof, which is not repeated here.

Figure 25:
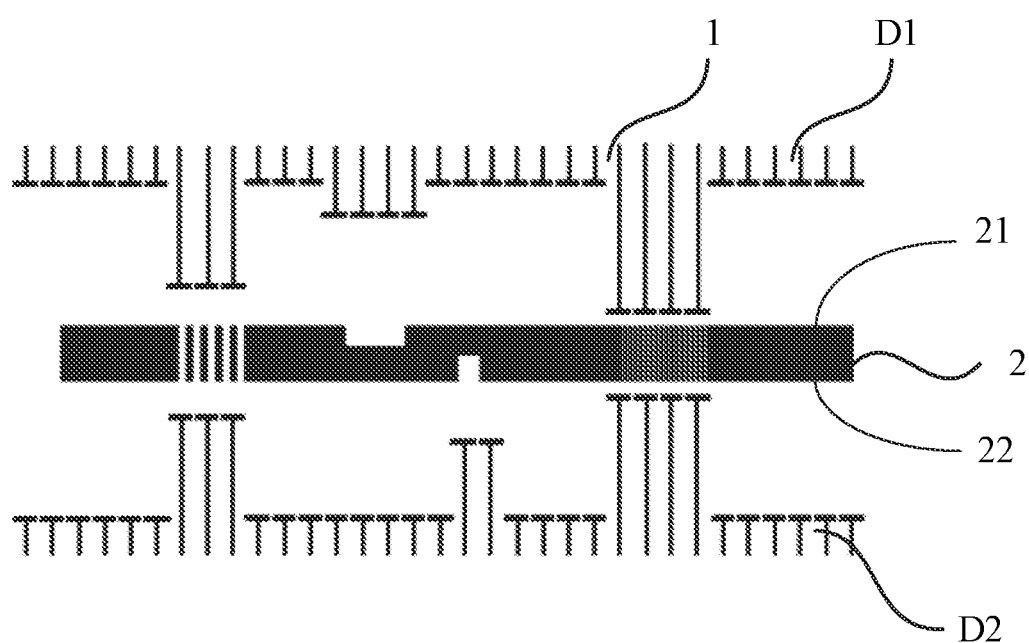
FIG. 25 is a structural schematic illustrating an electroplating device according to some embodiments of the present disclosure.

FIG. 25 is a structural schematic illustrating an electroplating device according to some embodiments of the present disclosure. Referring to FIG. 25, the electroplating device may include two electroplating anodes 1 and the cathode 2. The cathode 2 may include a first surface 21 and a second surface 22. The two electroplating anodes 1 may include a first electroplating anode D1 and a second electroplating anode D2. The first electroplating anode D1 may oppose the first surface 21 of the cathode 2. A morphology of the first electroplating anode D1 may be in conformity with or approximately in conformity with a morphology the first surface 21 of the cathode 2. The first electroplating anode D1 and the cathode 2 may form an electric field to deposit an electroplating layer on the first surface 21 of the cathode 2. The second electroplating anode D2 may oppose the second surface 22 of the cathode 2. A morphology of the second electroplating anode D2 may be in conformity with or approximately in conformity with a morphology the second surface 22 of the cathode 2. The second electroplating anode D2 and the cathode 2 may form an electric field to deposit an electroplating layer on the second surface 22 of the cathode 2.

The first surface 21 and the second surface 22 of the cathode 2 to be electroplated may be electroplated simultaneously using the first electroplating anode D1 and the second electroplating anode D2. As another example, the first surface 21 of the cathode 2 may be electroplated using the first electroplating anode D1 first, and then the second surface 22 of the cathode 2 may be electroplated using the second electroplating anode D2. As another example, the second surface 22 of the cathode 2 may be electroplated using the second electroplating anode D2 first, and then the first surface 21 of the cathode 2 may be electroplated using the first electroplating anode D1.

The electroplating anode 1 (including the first electroplating anode D1 and the second electroplating anode D2) may include the electroplating anode described in any embodiments of the present disclosure. The electroplating method using the electroplating anode 1 may include the electroplating method described in any embodiments of the present disclosure.

What is claimed is:

1. A system for an electrochemical process, comprising:
a first electrode;
a second electrode;
an electric field distribution simulation optimizer; and
an electric field distribution controller; wherein:
the first electrode and the second electrode form an electric field to change a substance on the second electrode,
a morphology of the second electrode is uneven, and
the first electrode includes:
a first electrically insulating backplate; and
a plurality of electrically conducting units, wherein
each of the plurality of electrically conducting units includes a needle rod and a needle head that is configured at an end of the needle rod, the end of the needle rod with the needle head being configured as a functioning end of the electrically conducting unit, the electrically conducting unit being supported by the first electrically insulating backplate via the needle rod,
the plurality of electrically conducting units are arranged in an array, and
any two of the plurality of electrically conducting units are electrically insulated from each other;
the electric field distribution simulation optimizer is configured to:
simulate the electric field between and on the first electrode and the second electrode and a change of the substance on the second electrode based on morphological information of the second electrode, a morphology of the first electrode, and a surface current distribution of the first electrode;
determine, using an optimization algorithm and according to an optimization target including a distribution and a change in a thickness of the substance on a surface of the second electrode, at least one of an optimized morphology of the first electrode and an optimized surface current distribution of the first electrode; and
transmit information of the at least one of the optimized morphology of the first electrode and the optimized surface current distribution of the first electrode to the electric field distribution controller; and
the electric field distribution controller is configured to perform at least one of the following operations:
controlling a processing signal that is output to each of the plurality of electrically conducting units; and
controlling an extension distance or a retraction distance of at least one needle rod for adjusting the morphology of the first electrode.

2. The system of claim 1, wherein
the first electrode is an electroplating anode, the functioning end of each of at least some of the plurality of electrically conducting units of the first electrode including an electroplating end,
the second electrode is a cathode to be electroplated, and
the first electrode and the second electrode form the electric field to deposit an electroplating layer on a surface of the second electrode.

3. The system of claim 1, wherein
the first electrode is a cathode, the functioning end of each of at least some of the plurality of electrically conducting units of the first electrode including an etching end,
the second electrode is an anode to be etched, and
the first electrode and the second electrode form the electric field to etch a surface of the second electrode.

4. The system of claim 1, further comprising:
a signal controller, and
a plurality of feeders, wherein
each of the plurality of electrically conducting units is electrically connected to the signal controller via one of the plurality of feeders, and
the signal controller is configured to apply the processing signal to each of the plurality of electrically conducting units.

5. The system of claim 4, further comprising:
a second electrically insulating backplate, wherein the needle rod penetrates the first electrically insulating backplate and the second electrically insulating backplate, and an electrical connection between the feeder and the electrically conducting unit is located between the first electrically insulating backplate and the second electrically insulating backplate.

6. The system of claim 4, further comprising:
a driver controller, and
a plurality of drivers that are electrically connected with the driver controller, wherein each of the plurality of drivers is connected to an end of a corresponding needle rod that is away from the needle head, and is configured to control a distance between the needle head and the first electrically insulating backplate.

7. The system of claim 6, further comprising:
a surface morphology detector, wherein:
an input end of the electric field distribution simulation optimizer is electrically connected to the surface morphology detector,
an output end of the electric field distribution simulation optimizer is electrically connected to the electric field distribution controller,
the electric field distribution controller is electrically connected to the signal controller,
the electric field distribution controller is electrically connected to the driver controller;
at an initial stage of the electrochemical process,
the electric field distribution simulation optimizer
obtains initial morphological information of the second electrode from the surface morphology detector;
simulates the electric field between and on the first electrode and the second electrode and the change of the substance on the second electrode based on the initial morphological information of the second electrode, an initial morphology of the first electrode, and an initial surface current distribution of the first electrode;
determines, using the optimization algorithm and according to the optimization target including the distribution and the change in the thickness of the substance on the surface of the second electrode, an initial optimized morphology of the first electrode and an initial optimized surface current distribution of the first electrode; and
transmits information of the initial optimized morphology of the first electrode and the initial optimized surface current distribution of the first electrode to the electric field distribution controller;

the electric field distribution controller controls the processing signal that is output by the signal controller to each of the plurality of electrically conducting units; and the electric field distribution controller controls the driver controller to transmit, to the plurality of drivers, different control signals each of which specifies the extension distance or the retraction distance of one needle rod for adjusting the morphology of the first electrode;

during the electrochemical process, the electric field distribution simulation optimizer (1) obtains real-time morphological information of the second electrode from the surface morphology detector;

(2) simulates the electric field between and on the first electrode and the second electrode and the change of the substance on the second electrode based on the real-time morphological information of the second electrode, a current morphology of the first electrode, and a current surface current distribution of the first electrode;

(3) determines a further optimized morphology of the first electrode and a further optimized surface current distribution of the first electrode according to the optimization target using the optimizing algorithm; wherein the current morphology of the first electrode in a current optimization operation is the initial optimized morphology of the first electrode in the initial stage or the further optimized morphology of the first electrode in a previous optimization operation of the electrochemical process, and the current surface current distribution of the first electrode in the current optimization operation of the electrochemical process is the initial optimized surface current distribution of the first electrode in the initial stage or the further optimized surface current distribution of the previous optimization operation of the electrochemical process; and (4) transmits information of the further optimized morphology of the first electrode and the further optimized surface current distribution of the first electrode to the electric field distribution controller; and (5) the electric field distribution controller controls the processing signal that is output by the signal controller to each of the plurality of electrically conducting units;

(6) the electric field distribution controller controls the driver controller to transmit, to the plurality of drivers, different control signals each of which specifies the extension distance or the retraction distance of one needle rod for adjusting the morphology of the first electrode; and during the electrochemical process, the electric field distribution simulation optimizer and the electric field distribution controller repeat operations (1)-(6) until the morphology of the second electrode satisfies the optimization target, or a difference between the morphology of the second electrode and the optimization target reaches a preset value.

8. The system of claim 6, wherein:

the electric field distribution simulation optimizer is electrically connected to the electric field distribution controller, the electric field distribution controller is electrically connected to the signal controller, the electric field distribution controller is electrically connected to the driver controller;

at an initial stage of the electrochemical process, the electric field distribution simulation optimizer simulates the electric field between and on the first electrode and the second electrode and the change of the substance on the second electrode based on input initial morphological information of the second electrode, an initial morphology of the first electrode, and an initial surface current distribution of the first electrode;

determines, using the optimization algorithm and according to the optimization target including the distribution and the change in the thickness of the substance on the surface of the second electrode, an initial optimized morphology of the first electrode and an initial optimized surface current distribution of the first electrode;

obtains the morphology of the second electrode after a current optimization operation that is closer to the optimization target; and transmits information of the initial optimized morphology of the first electrode and the initial optimized surface current distribution of the first electrode to the electric field distribution controller;

the electric field distribution controller controls the processing signal that is output by the signal controller to each of the plurality of electrically conducting units; and the electric field distribution controller controls the driver controller to transmit, to the plurality of drivers, different control signals each of which specifies the extension distance or the retraction distance of one needle rod for adjusting the morphology of the first electrode; and during the electrochemical process, the electric field distribution simulation optimizer (1) simulates the electric field between and on the first electrode and the second electrode and the change of the substance on the second electrode based on the morphology of the second electrode after a previous optimization operation that is closer to the optimization target, a current morphology of the first electrode, and a current surface current distribution of the first electrode;

(2) determines a further optimized morphology of the first electrode and a further optimized surface current distribution of the first electrode according to the optimization target using the optimization algorithm; wherein the current morphology of the first electrode in the current optimization operation is the initial optimized morphology of the first electrode in the initial stage or the further optimized morphology of the first electrode in the previous optimization operation of the electrochemical process, and the current surface current distribution of the first electrode in the current optimization operation of the electrochemical process is the initial optimized surface current distribution of the first electrode in the initial stage or the further optimized surface current distribution of the previous optimization operation of the electrochemical process;

(3) obtains the morphology of the second electrode after the current optimization operation that is closer to the optimization target; and (4) transmits information of the further optimized morphology of the first electrode and the further optimized surface current distribution of the first electrode to the electric field distribution controller;
(5) the electric field distribution controller controls the driver controller to transmit, to the plurality of drivers, different control signals each of which specifies the extension distance or the retraction distance of one needle rod for adjusting the morphology of the first electrode;
(6) the electric field distribution controller controls the processing signal that is output by the signal controller to each of the plurality of electrically conducting units; and during the electrochemical process, the electric field distribution simulation optimizer and the electric field distribution controller repeat operations (1)-(6) until the morphology of the second electrode satisfies the optimization target, or a difference between the morphology of the second electrode and the optimization target reaches a preset value.

9. The system of claim 6, further comprising:
a surface morphology detector, wherein:
an input end of the electric field distribution simulation optimizer is electrically connected to the surface morphology detector,
an output end of the electric field distribution simulation optimizer is electrically connected to the electric field distribution controller,
the electric field distribution controller is electrically connected to the driver controller;
at an initial stage of the electrochemical process,
the electric field distribution simulation optimizer
  obtains initial morphological information of the second electrode from the surface morphology detector;
  simulates the electric field between and on and on the first electrode and the second electrode and the change of the substance on the second electrode based on the initial morphological information of the second electrode, an initial morphology of the first electrode, and a surface current distribution of the first electrode;
  determines, using the optimization algorithm and according to the optimization target including the distribution and the change in the thickness of the substance on the surface of the second electrode, an initial optimized morphology of the first electrode based on the initial morphological information of the second electrode, the initial morphology of the first electrode, and the surface current distribution of the first electrode; and
  transmits information of the initial optimized morphology of the first electrode to the electric field distribution controller;
the electric field distribution controller controls the driver controller to transmit, to the plurality of drivers, different control signals each of which specifies the extension distance or the retraction distance of one needle rod;
during the electrochemical process,
the electric field distribution simulation optimizer
  (1) obtains real-time morphological information of the second electrode from the surface morphology detector;
  (2) determines, using the optimization algorithm and according to the optimization target, a further optimized morphology of the first electrode based on the real-time morphological information of the second electrode, the surface current distribution of the first electrode, and a current morphology of the first electrode; wherein the current morphology of the first electrode in a current optimization operation is the initial optimized morphology of the first electrode in the initial stage or the further optimized morphology of the first electrode in a previous optimization operation of the electrochemical process; and
  (3) transmits information of the further optimized morphology of the first electrode to the electric field distribution controller;
  (4) the electric field distribution controller controls the driver controller to transmit, to the plurality of drivers, different control signals each of which specifies the extension distance or the retraction distance of one needle rod; and during the electrochemical process, the electric field distribution simulation optimizer and the electric field distribution controller repeat operations (1)-(4) until the morphology of the second electrode satisfies the optimization target, or a difference between the morphology of the second electrode and the optimization target reaches a preset value.

10. The system of claim 6, wherein:
the electric field distribution simulation optimizer is electrically connected to the electric field distribution controller,
the electric field distribution controller is electrically connected to the driver controller,
the electric field distribution simulation optimizer
  simulates the electric field between and on and on the first electrode and the second electrode and the change of the substance on the second electrode based on an input initial morphological information of the second electrode, an initial morphology of the first electrode, and a surface current distribution of the first electrode;
  determines, using the optimization algorithm and according to the optimization target including the distribution and the thickness of the substance on the surface of the second electrode, an initial optimized morphology of the first electrode based on the input initial morphological information of the second electrode, the surface current distribution of the first electrode, and the initial morphology of the first electrode;
  obtains the morphology of the second electrode after a current optimization operation that is closer to the optimization target; and
  transmits information of the initial optimized morphology of the first electrode to the electric field distribution controller;
the electric field distribution controller controls the driver controller to transmit, to the plurality of drivers, different control signals each of which specifies the extension distance or the retraction distance of one needle rod;
during the electrochemical process,
the electric field distribution simulation optimizer
  (1) determines, using the optimization algorithm and according to the optimization target, a further optimized morphology of the first electrode based on the morphology of the second electrode after a previous optimization operation that is closer to the optimization target, the surface current distribution of the first electrode, and a current morphology of the first electrode; wherein the current surface current distribution of the first electrode in the current optimization operation of the electrochemical process is the initial optimized surface current distribution of the first electrode in the initial stage or the further optimized surface current distribution of the previous optimization operation of the electrochemical process;

(2) obtains the morphology of the second electrode after a current optimization operation that is closer to the optimization target; and (3) transmits information of the further optimized morphology of the first electrode to the electric field distribution controller; and (4) the electric field distribution controller controls the driver controller to transmit, to the plurality of drivers, different control signals each of which specifies the extension distance or the retraction distance of one needle rod; and during the electroplating process, the electric field distribution simulation optimizer repeats operations (1)-(4) until the morphology of the second electrode satisfies the optimization target, or a difference between the morphology of the second electrode and the optimization target reaches a preset value.

11. The system of claim 4, further comprising:
a surface morphology detector, wherein:
an input end of the electric field distribution simulation optimizer is electrically connected to the surface morphology detector,
an output end of the electric field distribution simulation optimizer is electrically connected to the electric field distribution controller,
the electric field distribution controller is electrically connected to the signal controller;
at an initial stage of the electrochemical process,
the electric field distribution simulation optimizer
  obtains initial morphological information of the second electrode from the surface morphology detector;
  simulates the electric field between and on the first electrode and the second electrode and the change of the substance on the second electrode based on the initial morphological information of the second electrode, the morphology of the first electrode, and an initial surface current distribution of the first electrode;
  determines, using the optimization algorithm and according to the optimization target including the distribution and the change in the thickness of the substance on the surface of the second electrode, an initial optimized surface current distribution of the first electrode; and
  transmits information of the initial optimized surface current distribution of the first electrode to the electric field distribution controller;
the electric field distribution controller controls the processing signal that is output by the signal controller to each of the plurality of electrically conducting units;
during the electrochemical process,
the electric field distribution simulation optimizer
  (1) obtains real-time morphological information of the second electrode from the surface morphology detector;
  (2) simulates the electric field between and on the first electrode and the second electrode and the change of the substance on the second electrode based on the real-time morphological information of the second electrode, the morphology of the first electrode, and a current surface current distribution of the first electrode;
  (3) determines a further optimized surface current distribution of the first electrode according to the optimization target using the optimization algorithm; wherein the current surface current distribution of the first electrode in a current optimization operation of the electrochemical process is the initial optimized surface current distribution of the first electrode in the initial stage or the further optimized surface current distribution of a previous optimization operation of the electrochemical process; and
  (4) transmits information of the further optimized surface current distribution of the first electrode to the electric field distribution controller; and
  (5) the electric field distribution controller controls the processing signal that is output by the signal controller to each of the plurality of electrically conducting units; and
during the electrochemical process, the electric field distribution simulation optimizer and the electric field distribution controller repeat operations (1)-(5) until the morphology of the second electrode satisfies the optimization target, or a difference between the morphology of the second electrode and the optimization target reaches a preset value.

12. The system of claim 4, wherein:
the electric field distribution simulation optimizer is electrically connected to the electric field distribution controller,
the electric field distribution controller is electrically connected to the signal controller,
at an initial stage of the electrochemical process,
the electric field distribution simulation optimizer
  simulates the electric field between and on the first electrode and the second electrode and the change of the substance on the second electrode based on input initial morphological information of the second electrode, the morphology of the first electrode, and an initial surface current distribution of the first electrode;
  determines, using the optimization algorithm and according to the optimization target including the distribution and the change in the thickness of the substance on the surface of the second electrode, an initial optimized surface current distribution of the first electrode;
  obtains the morphology of the second electrode after a current optimization operation that is closer to the optimization target; and
  transmits information of the initial optimized surface current distribution of the first electrode to the electric field distribution controller;
the electric field distribution controller controls the processing signal that is output by the signal controller to each of the plurality of electrically conducting units;
during the electrochemical process,
the electric field distribution simulation optimizer
  (1) simulates the electric field between and on the first electrode and the second electrode and the change of the substance on the second electrode based on the morphology of the second electrode after a previous optimization operation that is closer to the optimization target, the morphology of the first electrode, and a current surface current distribution of the first electrode;

(2) determines an further optimized surface current distribution of the first electrode according to the optimization target using the optimization algorithm; wherein the current surface current distribution of the first electrode in the current optimization operation of the electrochemical process is the initial optimized surface current distribution of the first electrode in the initial stage or the further optimized surface current distribution of the previous optimization operation of the electrochemical process;

(3) obtains the morphology of the second electrode after a current optimization operation that is closer to the optimization target; and (4) transmits information of the further optimized surface current distribution of the first electrode to the electric field distribution controller;

(5) the electric field distribution controller controls the processing signal that is output by the signal controller to each of the plurality of electrically conducting units; and during the electrochemical process, the electric field distribution simulation optimizer and the electric field distribution controller repeat operations (1)-(5) until the morphology of the second electrode satisfies the optimization target, or a difference between the morphology of the second electrode and the optimization target reaches a preset value.

13. The system of claim 1, further comprising:
an electrically insulating thread, and
an electrically insulating nut, wherein:
the electrically insulating nut is fixed on the first electrically insulating backplate,
the electrically insulating thread is disposed on the needle rod, and
the electrically insulating thread is engaged with the electrically insulating nut.

14. The system of claim 1, further comprising:
a mold substrate,
a bonding layer, and
a feeder plate, wherein
the bonding layer is located between the mold substrate and the first electrically insulating backplate,
a morphology of the mold substrate facing the first electrically insulating backplate is in conformity with the morphology of the second electrode, a protruding portion of the mold substrate corresponding to a recessing portion of the second electrode, and a recessing portion of the mold substrate corresponding to a recessing portion of the second electrode, and
the feeder plate is in contact with and electrically connected to the plurality of electrically conducting units.

15. The system of claim 14, further comprising a signal controller, wherein:
the electric field distribution controller is electrically connected to the signal controller and the electric field distribution simulation optimizer, respectively; and
the signal controller is electrically connected to the plurality of electrically conducting units, the signal controller being configured to apply the processing signal to the plurality of electrically conducting units.

16. The system of claim 15, wherein before the electrochemical process starts,
the electric field distribution simulation optimizer
simulates the electric field between and on the second electrode and the first electrode, and a deposition of the substance on the second electrode based on input initial morphological information of the second electrode, an initial morphology of the first electrode, and an initial surface current distribution of the first electrode;
determines, using the optimization algorithm and according to the optimization target including the distribution and the thickness of the substance on the surface of the second electrode, an optimized morphology of the first electrode and an optimized surface current distribution of the first electrode;
prepares the mold substrate based on the optimized morphology of the first electrode; and
transmits information of the optimized surface current distribution of the first electrode to the electric field distribution controller; and
the electric field distribution controller controls the processing signal that is output by the signal controller to the plurality of electrically conducting units.

17. The system of claim 15, wherein before the electrochemical process starts,
the electric field distribution simulation optimizer
simulates the electric field between and on the second electrode and the first electrode and a deposition of the substance on the second electrode based on input initial morphological information of the second electrode, an initial morphology of the first electrode, and an initial surface current distribution of the first electrode;
determines, using the optimization algorithm and according to the optimization target including the distribution and the thickness of the substance on the surface of the second electrode, an initial optimized morphology of the first electrode and an initial optimized surface current distribution of the first electrode;
prepares the mold substrate based on the initial optimized morphology of the first electrode; and
obtains the morphology of the second electrode after a current optimization operation that is closer to the optimization target; and
transmits information of the initial optimized surface current distribution of the first electrode to the electric field distribution controller;
the electric field distribution controller controls the processing signal that is output by the signal controller to the plurality of electrically conducting units;
during the electrochemical process,
the electric field distribution simulation optimizer
(1) simulates the electric field between and on the second electrode and the first electrode and the deposition of the substance on the second electrode based on the morphology of the second electrode after a previous optimization operation that is closer to the optimization target, the morphology of the mold substrate, and the current surface current distribution of the first electrode;
(2) determines a further optimized surface current distribution of the first electrode according to the optimization target using the optimization algorithm; wherein the current surface current distribution of the first electrode in the current optimization operation of the electrochemical process is the initial optimized surface current distribution of the first electrode in the initial stage or the further optimized surface current distribution of the previous optimization operation of the electrochemical process;

(3) obtains the morphology of the second electrode after a current optimization operation that is closer to the optimization target; and (4) transmits information of the further optimized surface current distribution of the first electrode to the electric field distribution controller;

(5) the electric field distribution controller controls the processing signal that is output by the signal controller to the plurality of electrically conducting units; and during the electrochemical process, the electric field distribution simulation optimizer repeats operations (1)-(5) until the morphology of the first electrode satisfies the optimization target, or a difference between the morphology of the second electrode and the optimization target reaches a preset value.

18. The system of claim 1, wherein:

at an initial stage of the electrochemical process, the electric field distribution simulation optimizer obtains initial morphological information of the second electrode;

simulates the electric field between and on the first electrode and the second electrode and the change of the substance on the second electrode based on the initial morphological information of the second electrode, an initial morphology of the first electrode, and an initial surface current distribution of the first electrode;

determines, using the optimization algorithm and according to the optimization target including the distribution and the change in the thickness of the substance on the surface of the second electrode, at least one of an initial optimized morphology of the first electrode and an initial optimized surface current distribution of the first electrode; and transmits information of the at least one of the initial optimized morphology of the first electrode and the initial optimized surface current distribution of the first electrode to the electric field distribution controller;

the electric field distribution controller performs at least one of the following operations including:

controlling the processing signal that is output to each of the plurality of electrically conducting units; and controlling the extension distance or the retraction distance of the at least one needle rod for adjusting the morphology of the first electrode;

during the electrochemical process, the electric field distribution simulation optimizer (1) simulates the electric field between and on the first electrode and the second electrode and the change of the substance on the second electrode based on a current morphological information of the second electrode, the morphology of the first electrode, and the surface current distribution of the first electrode;

(2) determines at least one of a further optimized morphology of the first electrode and a further optimized surface current distribution of the first electrode according to the optimization target using the optimizing algorithm; wherein the morphology of the first electrode in a current optimization operation is the initial optimized morphology of the first electrode in the initial stage or the further optimized morphology of the first electrode in a previous optimization operation of the electrochemical process, or the surface current distribution of the first electrode in the current optimization operation of the electrochemical process is the initial optimized surface current distribution of the first electrode in the initial stage or the further optimized surface current distribution of the previous optimization operation of the electrochemical process; and (3) transmits information of the at least one of the further optimized morphology of the first electrode and the further optimized surface current distribution of the first electrode to the electric field distribution controller; and (4) the electric field distribution controller performs at least one of the following operations including:

controlling the processing signal that is output to each of the plurality of electrically conducting units;

controlling the extension distance or the retraction distance of the at least one needle rod for adjusting the morphology of the first electrode; and during the electrochemical process, the electric field distribution simulation optimizer and the electric field distribution controller repeat operations (1)-(4) until the morphology of the second electrode satisfies the optimization target, or a difference between the morphology of the second electrode and the optimization target reaches a preset value.

19. The system of claim 1, wherein at an initial stage of the electrochemical process, the electric field distribution simulation optimizer simulates the electric field between and on the first electrode and the second electrode and the change of the substance on the second electrode based on input initial morphological information of the second electrode, an initial morphology of the first electrode, and an initial surface current distribution of the first electrode;

determines, using the optimization algorithm and according to the optimization target including the distribution and the change in the thickness of the substance on the surface of the second electrode, at least one of an initial optimized morphology of the first electrode and an initial optimized surface current distribution of the first electrode;

obtains the morphology of the second electrode after a current optimization operation that is closer to the optimization target; and transmits information of the at least one of the initial optimized morphology of the first electrode and the initial optimized surface current distribution of the first electrode to the electric field distribution controller;

the electric field distribution controller performs at least one of the following operations including:

controlling the processing signal that is output to each of the plurality of electrically conducting units; and controlling the extension distance or the retraction distance of one needle rod for adjusting the morphology of the first electrode; and during the electrochemical process, the electric field distribution simulation optimizer (1) simulates the electric field between and on the first electrode and the second electrode and the change of the substance on the second electrode based on the morphology of the second electrode after a previous optimization operation that is closer to the optimization target, the morphology of the first electrode, and the surface current distribution of the first electrode;

(2) determines at least one of a further optimized morphology of the first electrode and a further optimized surface current distribution of the first electrode according to the optimization target using the optimization algorithm; wherein the morphology of the first electrode in the current optimization operation is the initial optimized morphology of the first electrode in the initial stage or the further optimized morphology of the first electrode in the previous optimization operation of the electrochemical process, or the surface current distribution of the first electrode in the current optimization operation of the electrochemical process is the initial optimized surface current distribution of the first electrode in the initial stage or the further optimized surface current distribution of the previous optimization operation of the electrochemical process;

(3) obtains the morphology of the second electrode after the current optimization operation that is closer to the optimization target; and (4) transmits information of the at least one of the further optimized morphology of the first electrode and the further optimized surface current distribution of the first electrode to the electric field distribution controller;

(5) the electric field distribution controller performs at least one of the following operations including:
controlling the extension distance or the retraction distance of the at least one needle rod for adjusting the morphology of the first electrode;
controlling the processing signal that is output to each of the plurality of electrically conducting units; and during the electrochemical process, the electric field distribution simulation optimizer and the electric field distribution controller repeat operations (1)-(5) until the morphology of the second electrode satisfies the optimization target, or a difference between the morphology of the second electrode and the optimization target reaches a preset value.

20. The system of claim 1, further comprising: a surface morphology detector, wherein:
at an initial stage of the electrochemical process,
the electric field distribution simulation optimizer
obtains initial morphological information of the second electrode from the surface morphology detector;
simulates the electric field between and on the first electrode and the second electrode and the change of the substance on the second electrode based on the initial morphological information of the second electrode, an initial morphology of the first electrode, and an initial surface current distribution of the first electrode;
determines, using the optimization algorithm and according to the optimization target including the distribution and the change in the thickness of the substance on the surface of the second electrode, at least one of an initial optimized morphology of the first electrode and an initial optimized surface current distribution of the first electrode; and transmits information of the at least one of the initial optimized morphology of the first electrode and the initial optimized surface current distribution of the first electrode to the electric field distribution controller;
the electric field distribution controller performs at least one of the following operations including:
controlling the processing signal that is output to each of the plurality of electrically conducting units; and
controlling the extension distance or the retraction distance of the at least one needle rod for adjusting the morphology of the first electrode;
during the electrochemical process,
the electric field distribution simulation optimizer
(1) obtains real-time morphological information of the second electrode from the surface morphology detector;
(2) simulates the electric field between and on the first electrode and the second electrode and the change of the substance on the second electrode based on the real-time morphological information of the second electrode, the morphology of the first electrode, and the surface current distribution of the first electrode;
(3) determines at least one of a further optimized morphology of the first electrode and a further optimized surface current distribution of the first electrode according to the optimization target using the optimizing algorithm; wherein the morphology of the first electrode in a current optimization operation is the initial optimized morphology of the first electrode in the initial stage or the further optimized morphology of the first electrode in a previous optimization operation of the electrochemical process, or the surface current distribution of the first electrode in the current optimization operation of the electrochemical process is the initial optimized surface current distribution of the first electrode in the initial stage or the further optimized surface current distribution of the previous optimization operation of the electrochemical process; and
(4) transmits information of the at least one of the further optimized morphology of the first electrode and the further optimized surface current distribution of the first electrode to the electric field distribution controller; and
(5) the electric field distribution controller performs at least one of the following operations including:
controlling the processing signal that is output to each of the plurality of electrically conducting units;
controlling the extension distance or the retraction distance of the at least one needle rod for adjusting the morphology of the first electrode; and during the electrochemical process, the electric field distribution simulation optimizer and the electric field distribution controller repeat operations (1)-(5) until the morphology of the second electrode satisfies the optimization target, or a difference between the morphology of the second electrode and the optimization target reaches a preset value.

* * * * *